US012024594B2

(12) United States Patent
Prenger et al.

(10) Patent No.: US 12,024,594 B2
(45) Date of Patent: Jul. 2, 2024

(54) MULTIFUNCTIONAL MATERIALS FOR TEMPORARY BONDING

(71) Applicant: Brewer Science, Inc., Rolla, MO (US)

(72) Inventors: Luke M. Prenger, Rolla, MO (US); Qi Wu, Peoria, AZ (US); Xiao Liu, Rolla, MO (US)

(73) Assignee: Brewer Science, Inc., Rolla, MO (US)

( * ) Notice: Subject to any disclaimer, the term of this patent is extended or adjusted under 35 U.S.C. 154(b) by 670 days.

(21) Appl. No.: 17/241,174

(22) Filed: Apr. 27, 2021

(65) Prior Publication Data
US 2021/0332188 A1    Oct. 28, 2021

Related U.S. Application Data

(60) Provisional application No. 63/015,897, filed on Apr. 27, 2020.

(51) Int. Cl.
  *C08G 73/00*   (2006.01)
  *B32B 7/12*    (2006.01)
  (Continued)

(52) U.S. Cl.
  CPC ............... *C08G 73/00* (2013.01); *B32B 7/12* (2013.01); *B32B 17/06* (2013.01); *B32B 43/006* (2013.01); *C09J 179/00* (2013.01); *H01L 21/6835* (2013.01); *B32B 2307/412* (2013.01); *B32B 2457/00* (2013.01); *H01L 2221/68381* (2013.01)

(58) Field of Classification Search
  CPC ............ B32B 17/06; B32B 2037/1215; B32B 2310/0843; B32B 2037/412; B32B 2457/00; B32B 2457/14; B32B 37/1207; B32B 38/10; B32B 43/006; B32B 7/12; C08G 73/00; C08G 73/024; C08G 73/0253; C09J 179/00; H01L 21/6835; H01L 2221/68318; H01L 2221/68327; H01L 2221/6834; H01L 2221/68381
  USPC ........... 156/60, 91, 153, 154, 242, 246, 247, 156/272.2, 272.8, 325, 326, 327, 330.9,
  (Continued)

(56) References Cited

U.S. PATENT DOCUMENTS

| | | | |
|---|---|---|---|
| 4,322,554 | A | 3/1982 | Herrmann et al. |
| 5,378,795 | A | 1/1995 | Bryant |

(Continued)

FOREIGN PATENT DOCUMENTS

WO    2015/046332    4/2015

OTHER PUBLICATIONS

Machine Translation of WO2015/046332, 69 pages.
(Continued)

*Primary Examiner* — Philip C Tucker
*Assistant Examiner* — Brian R Slawski
(74) *Attorney, Agent, or Firm* — HOVEY WILLIAMS LLP

(57) ABSTRACT

The materials and methods disclosed can be used for applications such as temporary bond and debond of semiconductor and display substrates. These materials have sufficiently low melt rheologies to be used as a bonding layer and can crosslink/cure to allow for reduction in material flow over long periods of time. This class of materials also incorporates the ability to be used as a single-layer system for debonding purposes and typically uses laser debonding for its release mechanism. These materials also allow for solvent cleanability using very mild acidic conditions instead of the typical harsh conditions used on curable layers.

15 Claims, 11 Drawing Sheets

(51) Int. Cl.
  *B32B 17/06* (2006.01)
  *B32B 43/00* (2006.01)
  *C09J 179/00* (2006.01)
  *H01L 21/683* (2006.01)

(58) Field of Classification Search
  USPC ................ 156/331.8, 701, 711, 712; 216/36; 438/459
  See application file for complete search history.

(56) References Cited

U.S. PATENT DOCUMENTS

| 10,023,540 | B2 | 7/2018 | Hikida et al. |
| 2014/0342530 | A1 | 11/2014 | Yasuda et al. |
| 2015/0064385 | A1 | 3/2015 | Flaim et al. |
| 2019/0113845 | A1 | 4/2019 | Yorisue et al. |

OTHER PUBLICATIONS

International Search Report and Written Opinion mailed Aug. 12, 2021 in corresponding PCT/US2021/029322 filed Apr. 27, 2021, 10 pages.

Deng et al., "Preparation of Reversible Thermosets and Their Application in Temporary Adhesive for Thin Wafer Handling," 2015 IEEE 65th Electronic Components and Technology Conference (ECTC), IEEE, Jul. 2015, 7 pages.

MULTIFUNCTIONAL MATERIALS FOR TEMPORARY BONDING

RELATED APPLICATIONS

The present application claims the priority benefit of U.S. Provisional Patent Application Ser. No. 63/015,897, filed Apr. 27, 2020, entitled MULTIFUNCTIONAL MATERIALS FOR TEMPORARY BONDING, incorporated by reference in its entirety herein.

BACKGROUND

Field

The present disclosure relates to materials useful for temporary bonding.

DESCRIPTION OF RELATED ART

Temporary wafer bonding ("TWB") normally refers to a process for attaching a device wafer or microelectronic substrate to a carrier wafer or substrate by means of a polymeric bonding material. After bonding, the device wafer is thinned typically to less than 50 µm and then processed to create through-silicon vias ("TSV"), redistribution layers, bond pads, and other circuit features on its backside. The carrier wafer supports the fragile device wafer during the backside processing, which can entail repeated cycling between ambient temperature and high temperature (>250° C.), mechanical shocks from wafer handling and transfer steps, and strong mechanical forces, such as those imposed during wafer back-grinding processes used to thin the device wafer. When all of this processing has been completed, the device wafer is usually attached to a film frame and then separated, or debonded, from the carrier wafer and cleaned before further operations take place.

Most TWB processes use either one or two layers between the device wafer and the carrier wafer. In the case of a two-layer system, the first layer is a polymeric bonding material. It can be thermoplastic, thermosetting, or photo-curing in nature. The polymeric bonding material layer is typically 10-120 µm thick and, more commonly, about 50-100 µm thick. The second layer is comparatively thin, typically less than 2 µm, and is present to enable facile separation of the bonded wafer pair after processing. The thin layer responds to radiation from a laser or other light source, which leads to decomposition of the layer itself or decomposition of the adjacent polymeric bonding material, causing bonding integrity to be lost within the structure and allowing it to come apart without applying mechanical force.

Currently, most of the temporary bonding/debonding platforms in market focus on multiple-layer structures, such as dual-layer systems that include a temporary bonding layer and a releasing layer. Multiple steps of coating and baking of each layer lead to increased cost of ownership as well as decreased throughput of the whole process. In contrast, a significant reduction of cost and improvement of throughput can be achieved by using a single material that functions as both a temporary bonding layer and laser release layer.

Laser-induced release is becoming a popular mode of debonding and materials are available for operating at laser wavelengths ranging from the ultraviolet (e.g., 248 nm, 308 nm, and 355 nm) to the near infrared (e.g., 1064 nm). Laser release technology provides high throughput and low stress during the release process, effective thin-substrate handling, and ease of application, even with large panels. Laser release technology can be utilized in different applications in packaging areas such as temporary bonding, fan-out wafer-level packaging, lamination, 2.5D/3D integration using through-silicon vias (TSVs), system-in-packaging (SiP), package-on-package (PoP), and other heterogeneous integration infrastructures.

SUMMARY

The present invention is broadly concerned with temporary bonding methods and structures formed by those methods. In one embodiment, a temporary bonding method comprises providing a stack comprising a first substrate, a bonding layer, and a second substrate. The first substrate has a back surface and a front surface. The bonding layer is adjacent the front surface and comprises a polyazomethine. The second substrate has a first surface adjacent the bonding layer. The bonding layer is exposed to laser energy so as to facilitate separation of the first and second substrates.

In a further embodiment, the invention provides a microelectronic structure comprising a first substrate having a back surface and a front surface. A bonding layer is adjacent the front surface, with the bonding layer comprising a polyazomethine. A second substrate having a first surface is adjacent the bonding layer, and at least one of the front surface and the first surface is a device surface.

In another embodiment, a polyazomethine comprising recurring monomers of a dialdehyde, an aromatic diamine, and an aliphatic diamine is provided.

In yet a further embodiment, a composition is provided where the composition comprises a polyazomethine dispersed or dissolved in a solvent system. The polyazomethine comprises recurring monomers of a dialdehyde, an aromatic diamine, and an aliphatic diamine.

DETAILED DESCRIPTION

Figure 1:
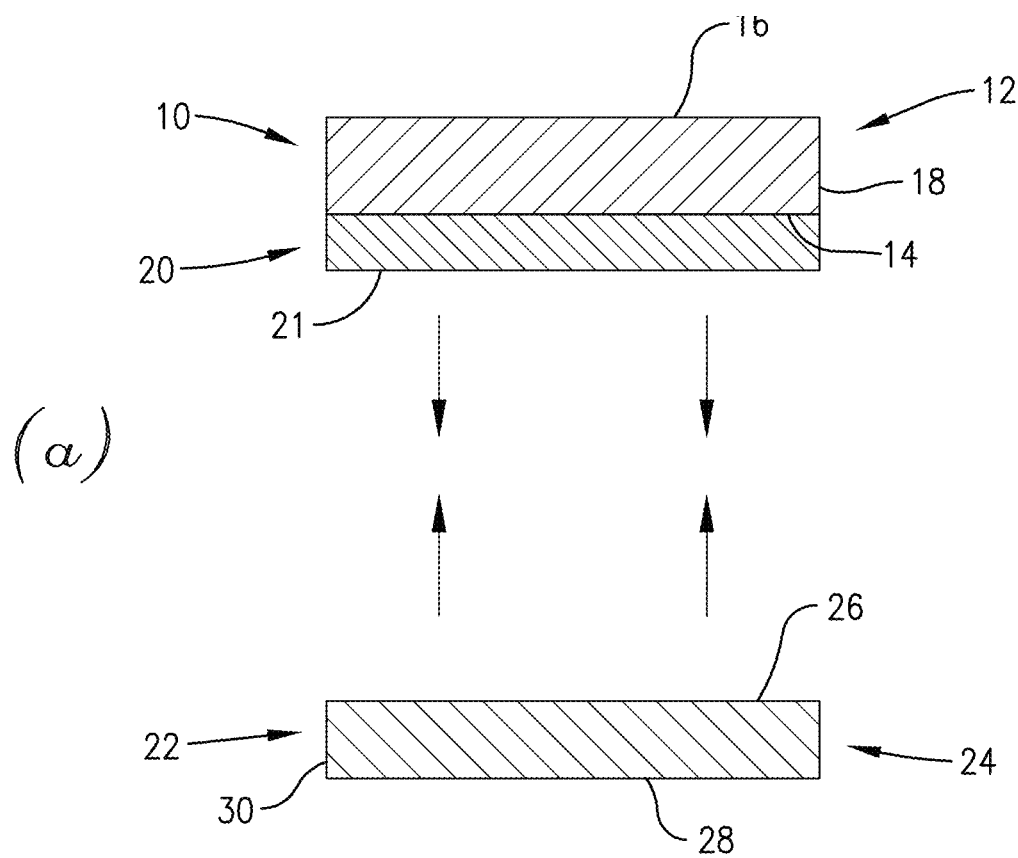
FIG. 1 is a cross-sectional view of a schematic drawing showing an exemplary temporary bonding process according to the invention.
Figure 1:
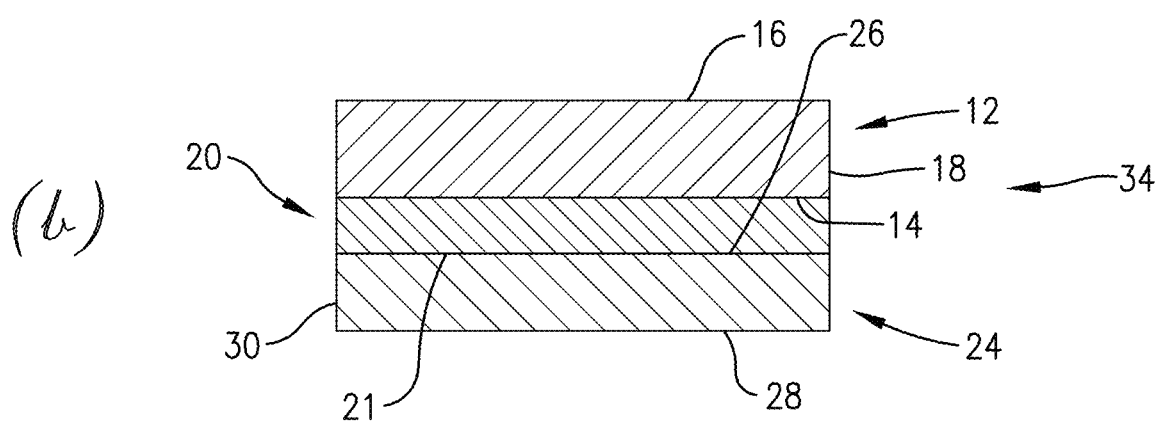

The present invention is concerned with novel compositions for use as temporary bonding compositions as well as methods of using those compositions.

Temporary Bonding

Polymers and Compositions

1. Polyazomethines

The compositions for use in the present invention comprise polyazomethines, and preferably linear polyazomethines. Preferred polyazomethines can be polymeric, oligomeric, or both, with the polyazomethines comprising first and second monomers. The first monomer is chosen from monomers comprising aldehyde and/or ketone groups, while the second monomer comprises an amine monomer. The aldehyde and/or ketone monomer preferably comprises two or more aldehyde and/or ketone groups, and the amine monomer preferably comprises two or more amino groups. In a particularly preferred embodiment, the first monomer comprises two or more aldehyde groups.

In more detail, the first monomer preferably comprises two or more aldehyde or ketone groups, or at least one aldehyde group and at least one ketone group. Aldehydes are particularly preferred, with dialdehydes being the most preferred first monomer. Preferred dialdehydes are chosen from terephthalaldehyde, 1,3-bis(4-formylphenoxy)-2-hydroxypropane ["4EPIDA"], isophthalaldehyde, {4-[(p-formylbenzoyloxy)methyl]cyclohexyl}methyl p-formylbenzoate, 2-(p-formylbenzoyloxy)ethyl p-formylbenzoate, 2-[2-(p-formylbenzoyloxy)ethoxy]ethyl p-formylbenzoate, 2-{2-[2-(p-formylbenzoyloxy)ethoxy]ethoxy}ethyl p-formylbenzoate, 2-(2-{2-[2-(p-formylbenzoyloxy)ethoxy]ethoxy}ethoxy)ethyl p-formylbenzoate, 4-(p-formylbenzoyloxy)cyclohexyl p-formylbenzoate, 3-(p-formylbenzoyloxy)cyclohexyl p-formylbenzoate, {4-[(p-formylbenzoyloxy)methyl]tricyclo[5.2.1.0$^{2,6}$]dec-8-yl}methyl p-formylbenzoate, p-{p-[p-(p-formylphenoxy)phenylsulfonyl]phenoxy}benzaldehyde, 4-{p-[p-(4-formyl-2-methoxyphenoxy)phenylsulfonyl]phenoxy}-3-anisaldehyde, (E)-5-(p-formylbenzoyloxy)-2-pentenyl p-formylbenzoate, 3-(allyloxy)-2-(p-formylbenzoyloxy)propyl p-formylbenzoate, 1,4-diacetylbenzene, (E)-5-(p-acetylbenzoyloxy)-2-pentenyl p-acetylbenzoate, 2-(p-acetylbenzoyloxy)-3-(allyloxy)propyl p-acetylbenzoate, 1-(4-{p-[p-(4-acetyl-2-methoxyphenoxy)phenylsulfonyl]phenoxy}-3-methoxyphenyl)-1-ethanone, 1-(p-{p-[p-(p-acetylphenoxy)phenylsulfonyl]phenoxy}phenyl)-1-ethanone, 3-(p-acetylbenzoyloxy)cyclohexyl p-acetylbenzoate, {4-[(p-acetylbenzoyloxy)methyl]tricyclo[5.2.1.0$^{2,6}$]dec-8-yl}methyl p-acetylbenzoate, 2-(2-{2-[2-(p-acetylbenzoyloxy)ethoxy]ethoxy}ethoxy)ethyl p-acetylbenzoate, 2-{2-[2-(p-acetylbenzoyloxy)ethoxy]ethoxy}ethyl p-acetylbenzoate, 2-[2-(p-acetylbenzoyloxy)ethoxy]ethyl p-acetylbenzoate, 2-(p-acetylbenzoyloxy)ethyl p-acetylbenzoate, {4-[(p-acetylbenzoyloxy)methyl]cyclohexyl}methyl p-acetylbenzoate, and combinations thereof. The first monomer is preferably present in the polymer from about 30 mol % to about 70 mol %, and more preferably from about 40 mol % to about 60 mol %, based on the polymer taken as 100 mol %.

The second monomer is chosen from aliphatic amines, aromatic amines, and combinations thereof. In a preferred embodiment, the second monomer is a combination of at least one aliphatic amine monomer (more preferably an aliphatic diamine monomer) and at least one aromatic amine (more preferably an aromatic diamine monomer), which effectively means the polyazomethine includes a third monomer (i.e., aldehyde monomer, aliphatic amine monomer, and aromatic amine monomer, but most preferably a dialdehyde monomer, aliphatic diamine monomer, and aromatic diamine monomer).

Preferred aliphatic amines impart flexibility to the polymer chain to improve material processing, while preferred aromatic amines impart photosensitivity to the polymer. The ratio and types of aromatic and aliphatic amines are selected so as to optimize the absorbance, rheology, and solubility of the polymer.

Preferred aliphatic amines include those chosen from 1,3-bis(aminopropyl)tetramethyldisiloxane, aminopropyl-terminated polydimethylsiloxane, 4,4'-methylenebis(2-methylcyclohexylamine, 2-methyl-1,5-diaminopentane, isophoronediamine, 1,12-diaminododecane, 1,7-diaminoheptane, 1,10-diaminodecane, 1,4-butanediol bis(3-aminopropyl) ether, 1,2-bis(2-aminoethoxy)ethane, diethylene glycol bis(3-aminopropyl) ether, 1,6-diaminohexane, 2,2-dimethyl-1,3-propanediamine, bis(aminomethyl)norbornane, 4,4'-methylenebis(cyclohexylamine), 1,3-bis(aminomethyl)cyclohexane, 1,4-bis(aminomethyl)cyclohexane, 1,3-cyclohexanediamine, 1,4-cyclohexanediamine, and combinations thereof.

Preferred aromatic amines include those chosen from 9,9-bis(4-aminophenyl)fluorene, 4,4'-methylenebis(2,6-diethylaniline), 2,2-bis[4-(4-aminophenoxy)phenyl]propane, 4,4'-(1,3-phenylenediisopropylidene)bisaniline, 4-aminophenyl sulfone, bis[4-(3-aminophenoxy)phenyl]sulfone, o-dianisidine, 1,5-diaminonaphthalene, m-xylylenediamine, p-xylylenediamine, 4,4'-diaminodiphenyl ether, bis(3-aminophenyl) sulfone, 1,3-phenylenediamine, 4,4'-diaminodiphenylmethane, 4,4'-methylenebis(2-chloroaniline), α,α'-bis(4-aminophenyl)-1,4-diisopropylbenzene, 1,4-phenylenediamine, 2,2-bis(4-aminophenyl)hexafluoropropane, 2,2'-bis(trifluoromethyl)benzidine, 2,7-diaminofluorene, 3,4'-diaminodiphenylmethane, 3,3',5,5'-tetramethylbenzidine, 9,9-bis(4-amino-3-methylphenyl)fluorene, bis(3-amino-4-hydroxyphenyl) sulfone, 3-aminobenzylamine, 1,4-bis(4-aminophenoxy)benzene, 1,3-bis(3-aminophenoxy)benzene, 2,2-bis[4-(4-aminophenoxy)phenyl]hexafluoropropane, 2,2-bis(3-amino-4-hydroxyphenyl)hexafluoropropane, 4,4'-bis(4-aminophenoxy)biphenyl, 1,1-bis(4-aminophenyl)cyclohexane, 3,4'-diaminodiphenyl ether, 4,4'-ethylenedianiline, 2,3,5,6-tetramethyl-1,4-phenylenediamine, 2,2-bis(3-amino-4-hydroxylphenyl)propane, 1,4-bis(4-amino-2-trifluoromethylphenoxy)benzene, 1,3-bis(4-aminophenoxy)benzene, bis[4-(4-aminophenoxy)phenyl] sulfone, 4,4'-methylenebis(2-ethyl-6-methylaniline), m-tolidine, bis(4-aminophenyl) sulfide, o-tolidine, 4,4'-diamino-3,3'-dimethyldiphenylmethane, 4,4'-diaminobenzophenone, 3,3'-diaminobenzophenone, 3,3'-diaminodiphenylmethane, 9,9-bis(4-amino-3-fluorophenyl)fluorene, 9,9-bis(4-amino-3-chlorophenyl)fluorene, 4,4'-diamino-2,2'-dimethylbibenzyl, and combinations thereof.

The second monomer (i.e., aromatic amines, aliphatic amines, or both) is preferably present in the polymer from about 30 mol % to about 70 mol %, and more preferably from about 40 mol % to about 60 mol %, based on the polymer taken as 100 mol %. When a combination of aromatic and aliphatic amines is utilized, the aliphatic amine is preferably present in the polymer from about 1 mol % to about 70 mol %, and more preferably from about 5 mol % to about 55 mol %, and the aromatic amine is preferably present in the polymer from about 1 mol % to about 70 mol %, and more preferably from about 5 mol % to about 55 mol %, based on the polymer taken as 100 mol %. When both an aromatic amine monomer and an aliphatic amine monomer are used, the molar ratio of aromatic amine to aliphatic amine is preferably from about 1:4 to about 4:1, and more preferably from about 1:2 to about 2:1.

The molar ratio of total amine monomers to total dialdehyde monomers is preferably from about 1:4 to about 4:1, more preferably from about 1:2 to about 2:1, and even more preferably about 1:1.

In general, the reaction to form the polyazomethines comprises a random reaction between the amine monomers and the aldehyde and/or ketone monomers to form an azomethine bond and the repeating structure of a polyazomethine. An example of one such reaction and a snapshot of the polymer or oligomer formed is shown below.

hyde and first amine monomer. After the first reaction, the second amine monomer is added to the reaction mixture and allowed to react, resulting in a polymer chain with nonhomogeneous repeat units. This preferred polymer structure further optimizes the polymer rheological, absorbance, and solubility properties. A schematic representation of the two-step reaction products is shown in Schematic A.

Schematic A

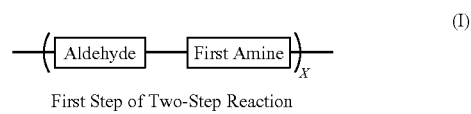

First Step of Two-Step Reaction (I)

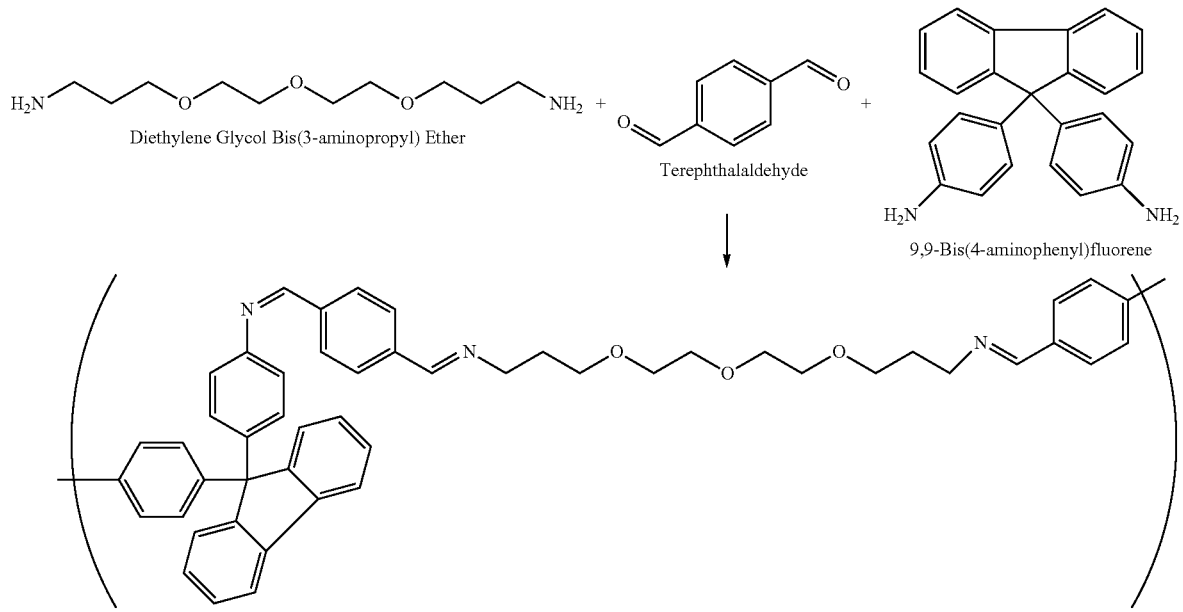

Polymer formation preferably occurs via a Schiff base reaction of the amine and dialdehyde moieties present on the respective monomers. The reaction may be conducted at or near room temperature or at an elevated temperature in an organic solvent or organic solvent mixture in the presence of an optional catalyst. Preferred reaction temperatures are from about 25° C. to about 200° C., and more preferably from about 25° C. to about 150° C. Preferred reaction times are from about 1 hour to about 24 hours, and more preferably from about 4 hours to about 16 hours. Water does not have to be removed from the reaction mixture in order to allow the reaction to move to completion but may be removed to increase efficiency. Additional solvent may be added to the reaction mixture after polymerization to maintain a manageable viscosity of the solution.

Although the monomers can be reacted in a single reaction, it is preferred to perform the reaction over two reaction steps when more than one amine monomer type is utilized. That is, the dialdehyde is allowed to react with one of the amine monomers until the reaction is complete. In this reaction, the dialdehyde is in excess, so the reaction will proceed until the first amine monomer is exhausted, resulting in oligomers or short(er) polymer chains of the dialde- -continued

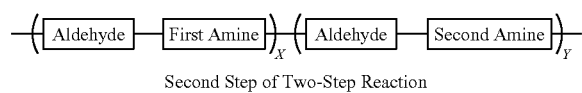

Second Step of Two-Step Reaction (II)

"X" and "Y" can be any number and will be determined by the quantities and ratios of starting monomers selected, with preferred overall percentages by weight and overall molar ratios in the polymer having been set forth above. Additionally, the bonds in the above schematic represent azomethine bonds.

It will be appreciated that the Second Step (II) of Schematic A forms random copolymers or oligomers. That is, the aldehyde with which the second amine reacts is not controlled. It might react with free aldehyde monomers present in the reaction solution, with aldehydes that previously reacted with the first amine (i.e., First Step (I) of Schematic A), or with both. Schematic B shows a generic structure illustrating this variation:

Schematic B

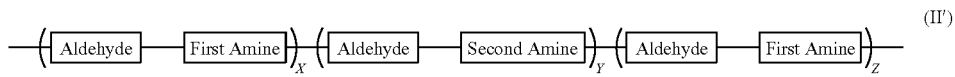

Z can be any number and will likewise be determined by the quantities and ratios of starting monomers selected, with preferred overall percentages by weight and overall molar ratios in the polymer having been set forth above. Additionally, in Schematic B, the first amine of the "Z" repeat could react with an available aldehyde-second amine structure, so that another "Y" repeat unit is added to the other end of the "Z" repeat unit.

Another example of a structure that can be formed according to either of the above reactions has the structure:

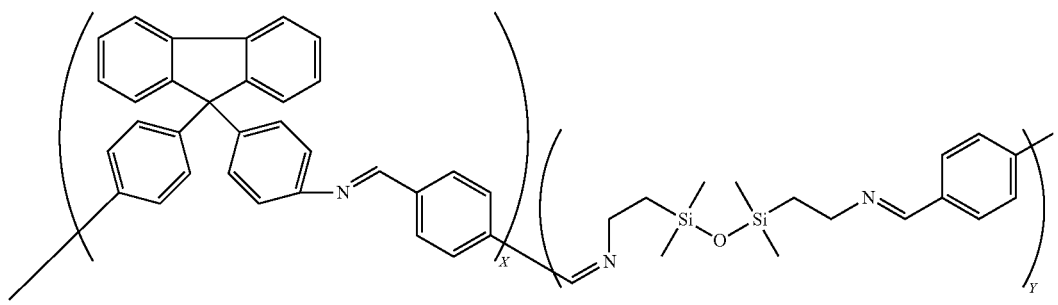

Again, "X" and "Y" can be any number and will be determined by the quantities and ratios of starting monomers selected, with preferred percentages by weight and molar ratios having been set forth above.

In some embodiments, one or more endcapping monomers can be utilized to further control the polymerization reaction and the molecular weight of the polymer. In one such embodiment, a monomer with a single functional group, such as a monofunctional aromatic or aliphatic aldehyde monomer, or monofunctional anhydride monomer may be added to the reaction mixture to terminate the polymer chain. Examples of suitable aldehyde monomers for use as an endcapping monomer include those chosen from benzaldehyde, trans-2-pentenal, trans-2-octenal, trans-2-decenal, trans-2-heptenal, valeraldehyde, 5-methyl-2-phenyl-2-hexenal, and combinations thereof.

Examples of suitable anhydride monomers for use as an endcapping monomer include those chosen from maleic anhydride, phthalic anhydride, succinic anhydride, 1,8-napthalic anhydride, phenylacetylene-modified trimellitic anhydride (such as that sold under the name NEXIMID® 300, by Nexam Chemical), and combinations thereof. It will be appreciated that any of these or other suitable endcapping monomers could be added to the above structures, thus terminating the polymer or oligomer represented in the above structures.

Suitable polymerization solvents include those chosen from gamma butyrolactone ("GBL"), dimethyl sulfoxide ("DMSO"), n-methyl-2-pyrrolidone ("NMP"), dimethylacetamide ("DMAC"), propylene glycol methyl ether acetate ("PGMEA"), benzyl alcohol, propylene glycol methyl ether ("PGME"), anisole, acetylene, d-limonene, toluene, and mixtures thereof. Preferred solvents are immiscible with water. Ketone-based solvents are preferably avoided due to potential reaction with the polymer chain, thus causing degradation of the chain. The solvent is preferably present in the reaction solution at from about 25% to about 95% by weight, and more preferably from about 40% to about 80% by weight, based upon the total weight of the reaction solution taken as 100% by weight.

Optionally, an acid catalyst may be used to speed up the reaction. Suitable acid catalysts include those chosen from butyric acid, acetic acid, sulfonic acids (such as p-toluenesulfonic acid ["pTSA"]), and sulfuric acid. The catalyst is preferably present in the polymerization mixture at levels of from about 1 mol % to about 5 mol %, and more preferably about 3 mol %, based on the total amine monomers taken as 100 mol %.

No further polymer isolation is required after preparation; the products can be left in solution and used as obtained. Optionally, the polymer may be precipitated and/or purified to be incorporated into a final formulation. Regardless, the preferred polymer weight average molecular weight is from about 1,000 to about 200,000 Daltons, and more preferably from about 5,000 to about 30,000 Daltons. The final materials exhibit strong absorbance at wavelengths of from about 200 nm to 400 nm, and preferably from about 300 nm to about 380 nm.

2. Polyazomethine Compositions

The bonding compositions for use in the invention are formed by simply dissolving the polyazomethine in a solvent system. The inventive compositions are formed by mixing the polymer and any optional ingredients with a solvent system. The resulting composition is stable at room temperature and can be coated easily onto microelectronic substrates.

Suitable solvent systems include, but are not limited to, anisole, PGME, PGMEA, d-limonene, mesitylene, isoamyl acetate, a propylene glycol derived glyme (such as that sold under the name PROGLYME by BASF Corporation), benzyl alcohol, dipropylene glycol dimethyl ether, NMP, dimethyl sulfoxide, and mixtures thereof. The solvent system is present in the material from about 20% by weight to about 99% by weight, and preferably from about 40% to about 90% by weight, based upon the total weight of the composition taken as 100% by weight. It will be appreciated that the amount of solvent or solvents added to the material may be different depending on the deposition method utilized.

The polymer is present in the material from about 1% by weight to about 80% by weight, and preferably from about 10% to about 60% by weight, based upon the total weight of the composition taken as 100% by weight.

Optionally, other additives may be added to the composition, including those chosen from surfactants, catalysts, and mixtures thereof. These additives would be selected depending on the desired properties and use of the final composition and must be soluble in the solvent system and compatible with the polymer in solution.

Suitable surfactants include nonionic fluorinated surfactants (R-30-N, FS-21, F-81, F556, FS3100, FS-4430, FS-4432, and FS-4434), nonionic non-fluorinated surfactants (such as those sold under the trade names EFAK®, LANCO™, ECOSURF™, Saponin, TERGITOL™, Triton™ and MERPOL®), and ionic non-fluorinated surfactants (poly(ethylene glycol) 4-nonylphenyl 3-sulfopropyl ether potassium salt and sodium dodecylbenzenesulfonate), and mixtures thereof. When a surfactant is included, it is present at levels of from about 0.01% by weight to about 2% by weight, preferably from about 0.05% by weight to about 0.5% by weight, and more preferably about 0.2% by weight, based upon the total weight of the composition taken as 100% by weight.

Suitable catalysts include those chosen from dicumyl peroxide, azobisisobutyronitrile, thermal acid generators, and mixtures thereof. Preferred thermal acid generators include blocked acids such as quaternary ammonium blocked triflic acid, with one example being that sold under the name K-PURE® TAG-2689 by King Industries, Inc. When a catalyst is included, it is present at levels of from about 0.01% by weight to about 3% by weight, preferably from about 0.05% by weight to about 3% by weight, and more preferably about 0.5% by weight, based upon the total weight of the composition taken as 100% by weight.

The Brookfield viscosity of the composition is preferably from about 10 cP to about 2500 cP, more preferably from about 100 cP to about 1200 cP, when measured at 25° C.

In one embodiment, the composition consists essentially of, or even consists of, the polyazomethine and solvent system.

In another embodiment, the composition consists essentially of, or even consists of, the polyazomethine, solvent system, and one or both of a surfactant and/or catalyst.

Methods of Using Temporary Bonding Compositions

Advantageously, the polyazomethine bonding composition described above can be used in a temporary bonding process to bond a device substrate to a carrier substrate, functioning as a bonding layer as well as a laser release material. In more detail and referring to FIG. 1(a) (not to scale), a precursor structure 10 is depicted in a schematic and cross-sectional view. Structure 10 includes a first substrate 12. Substrate 12 has a front or device surface 14, a back surface 16, and an outermost edge 18. Although substrate 12 can be of any shape, it would typically be circular in shape. Preferred first substrates 12 include device wafers such as those whose device surfaces comprise arrays of devices (not shown) selected from the group consisting of integrated circuits, MEMS, microsensors, power semiconductors, light-emitting diodes, photonic circuits, interposers, embedded passive devices, and other microdevices fabricated on or from silicon and other semiconducting materials such as silicon-germanium, gallium arsenide, gallium nitride, aluminum gallium arsenide, aluminum indium gallium phosphide, and indium gallium phosphide. The surfaces of these devices commonly comprise structures (again, not shown) formed from one or more of the following materials: silicon, polysilicon, silicon dioxide, silicon (oxy) nitride, metals (e.g., copper, aluminum, gold, tungsten, tantalum), low k dielectrics, polymer dielectrics, and various metal nitrides and silicides. The device surface 14 can also include at least one structure chosen from: solder bumps; metal posts; metal pillars; and structures formed from a material selected from the group consisting of silicon, polysilicon, silicon dioxide, silicon (oxy)nitride, metal, low k dielectrics, polymer dielectrics, metal nitrides, and metal silicides.

A laser-releasable bonding composition according to the invention is applied to the first substrate 12 to form a laser-releasable bonding layer 20 on the device surface 14, as shown in FIG. 1(a). Bonding layer 20 has an upper surface 21 remote from first substrate 12, and preferably, the bonding layer 20 is formed directly on the device surface 14 (i.e., without any intermediate layers between the bonding layer 20 and substrate 12). The bonding composition can be applied by any known application method. One preferred method involves spin-coating the composition at speeds of from about 100 rpm to about 3,000 rpm (preferably from about 400 rpm to about 1,500 rpm) for a time period of from about 10 seconds to about 180 seconds (preferably from about 30 seconds to about 90 seconds).

After the composition is applied, it is preferably heated to a temperature of from about 50° C. to about 300° C., and more preferably from about 100° C. to about 200° C., and for time periods of from about 30 seconds to about 20 minutes (preferably from about 60 seconds to about 6 minutes). In one embodiment, little to no crosslinking takes place during this heating. In other words, the resulting bonding layer 20 is preferably thermoplastic.

In some embodiments, it is preferable to subject the bonding layer 20 to a multi-stage bake process, depending upon the composition utilized. Also, in some instances, the above application and bake process can be repeated on a further aliquot of the composition, so that the bonding layer 20 is "built" on the first substrate 12 in multiple steps.

In a further embodiment, a laser-releasable bonding composition according to the invention can be formed into a preformed, dry film rather than applied as a flowable composition. In this instance, the composition is formed into an unsupported, self-sustaining film that doesn't collapse or change shape (absent application of force or energy) even though it is unsupported. This film can then be adhered to the first substrate 12 to form laser releasable bonding composition 20 shown in FIG. 1(a).

Regardless of how the bonding layer 20 is formed, it should have an average thickness (measured at five locations) of from about 1 μm to about 200 μm, more preferably from about 5 μm to about 100 μm, and even more preferably from about 10 μm to about 30 μm. Thicknesses as used herein can be measured using any film thickness measurement tool, with one preferred tool being an infrared interferometer, such as those sold by SUSS Microtec or Foothill.

The bonding layer 20 should also have a low total thickness variation ("TTV"), meaning that the thickest and thinnest points of the layer 20 are not dramatically different from one another. TTV is preferably calculated by measuring the thickness at a number of points or locations on the film, preferably at least about 50 points or at about 50 points, more preferably at least about 100 points or at about 100 points, and even more preferably at least about 1,000 points or at about 1,000 points. The difference between the highest and lowest thickness measurements obtained at these points is designated the TTV measurement for that particular layer. In some TTV measurement instances, edge exclusion or outliers may be removed from the calculation. In those cases, the number of included measurements is indicated by a percentage, that is, if a TTV is given at 97% inclusion, then 3% of the highest and lowest measurements are excluded, with the 3% split equally between the highest and lowest (i.e., 1.5% each). Preferably, the TTV ranges noted above are achieved using from about 95% to about 100% of the measurements, more preferably from about 97% to about 100% of the measurements, and even more preferably about 100% of the measurements.

In addition to a low TTV in terms of an absolute number (e.g., 5 μm), the TTV relative to the average film thickness of bonding layer 20 should be low. Thus, the bonding layer 20 should have a TTV on a blank substrate of less than about 25% of the average thickness, preferably less than about 10% of the average thickness, and more preferably less than about 5% of the average thickness of the bonding layer 20. For example, if the bonding layer 20 has an average thickness of 50 μm, the maximum acceptable TTV would be about 12.5 μm or lower (less than about 25% of 50 μm), preferably about 5 μm or lower (less than about 10% of 50 μm), and more preferably about 2.5 μm or lower (less than about 5% of 50 μm).

Additionally, laser-releasable bonding layer 20 will form a strong adhesive bond with the desired substrate. Anything with an adhesion strength of greater than about 50 psig, preferably from about 80 psig to about 250 psig, and more preferably from about 100 psig to about 150 psig, as determined by ASTM D4541/D7234, would be desirable for use as bonding layer 20.

The bonding layer 20 will have a k value of at least about 0.05, preferably at least about 0.1, and more preferably from about 0.12 to about 0.6, at wavelengths of from about 300 nm to about 380 nm.

Bonding layer 20 will have a complex viscosity of preferably less than 3000 Pa s at 160° C., more preferably from about 50 Pa s to about 1,500 Pa s at 160° C., and even more preferably from about 100 Pa s to about 1,000 Pa s at 160° C. Complex viscosity is preferably measured with a rheometer such as that sold under the name AR-2000ex rheometer by TA Instruments.

In one embodiment, the bonding compositions, and thus the resulting bonding layer 20, are preferably non-photosensitive (i.e., a pattern cannot be defined in the layer when it is exposed to about 1 J/cm$^2$). Thus, the composition used to form the bonding layer 20 as well as the resulting bonding layer 20 will be substantially free of photoacid generators (PAGs). "Substantially free" means that the composition and/or layer include less than about 0.1% by weight, preferably less than about 0.05 by weight %, and preferably about 0% by weight PAGs, based upon the total weight of the composition taken as 100% by weight. It's also substantially free of other agents capable of initiating polymerization or crosslinking upon light exposure.

A second precursor structure 22 is also depicted in a schematic and cross-sectional view in FIG. 1(a). Second precursor structure 22 includes a second substrate 24. In this embodiment, second substrate 24 is a carrier wafer. Second substrate 24 has a front or carrier surface 26, a back surface 28, and an outermost edge 30. Although second substrate 24 can be of any shape, it would typically be circular in shape and sized similarly to first substrate 12. Preferred second substrates 24 include a clear glass wafer or any other transparent (to laser energy) substrate that will allow the laser energy to pass through the carrier substrate. Especially preferred glass carrier wafers include Corning® EAGLE XG® glass, Gorilla® Glass, and soda lime glass.

Structures 10 and 22 are then pressed together in a face-to-face relationship, so that upper surface 21 of bonding layer 20 is in contact with front or carrier surface 26 of second substrate 24 (FIG. 1(b)). While pressing, sufficient pressure and heat are applied for a sufficient amount of time so as to effect bonding of the two structures 10 and 22 together to form a bonded stack 34. The bonding parameters will vary depending upon the composition from which bonding layer 20 is formed, but typical temperatures during this step will range from about 60° C. to about 300° C., and preferably from about 80° C. to about 220° C., with typical pressures ranging from about 500 N to about 10,000 N, and preferably from about 750 N to about 2,000 N, for a time period of from about 30 seconds to about 10 minutes, and preferably from about 2 minutes to about 5 minutes.

Bonded stack 34 is then heated on a hotplate or in an oven environment to cure bonding layer 20. Heating is preferably carried out at a temperature of about 120° C. to about 300° C., and preferably from about 120° C. to about 180° C., for a time period of about 30 seconds to about 20 minutes, and more preferably from about 1 minute to about 10 minutes. In one embodiment, a "two-step cure process" is carried by heating in two separate steps. In the first bake step, heating is preferably carried out at a temperature of about 120° C. to about 225° C., and preferably from about 150° C. to about 200° C., for a time period of about 30 seconds to about 20 minutes, and more preferably from about 2 minutes to about 20 minutes. In the second bake step, heating is preferably carried out at a temperature of about 200° C. to about 300° C., and preferably from about 225° C. to about 275° C., for a time period of about 30 seconds to about 20 minutes, and more preferably from about 2 minutes to about 20 minutes. In one embodiment, crosslinking takes place during this heating step, so that bonding layer 20 is a thermoset layer.

The bonded stack 34 should have a TTV of less than about 10% of the total average thickness, preferably less than about 5% of the total average thickness (measured at five locations across the stack 34), and even more preferably less than about 3% of the total average thickness of the bonded stack 34. That is, if the bonded stack 34 has an average thickness of 100 μm, TTV of less than about 10% would be about 10 μm or lower.

The first substrate 12 can now be safely handled and subjected to further processing that might otherwise have damaged first substrate 12 if not bonded to second substrate 24. Thus, the structure can safely be subjected to backside processing such as back-grinding, chemical-mechanical polishing ("CMP"), etching, metal deposition (i.e., metallization), dielectric deposition, patterning (e.g., photolithography, via etching), passivation, annealing, redistribution layer formation, and combinations thereof, without separation of substrates 12 and 24 occurring, and without infiltration of any chemistries encountered during these subsequent processing steps. Not only can bonding layer 20 survive these processes, it can also survive processing temperatures up to about 325° C., preferably from about 25° C. to about 300° C., and more preferably from about 80° C. to about 280° C.

Once processing is complete, the substrates 12 and 24 can be separated by using a laser to decompose or ablate all or part of the laser-releasable bonding layer 20. Suitable lasers include UV lasers, preferably at wavelengths from about 300 nm to about 360 nm, and more preferably at about 308 nm and/or at about 355 nm. In order to debond the laser-releasable bonding layer, a laser is scanned across the surface of the carrier wafer in a snake-like pattern in order to expose the entire wafer. Exemplary laser debonding tools include the SUSS MicroTec Lambda STEEL 2000 laser debonder, EVG®850 DB Automated Debonding System, and Kingyoup LD-Automatic 200/300 laser debonder. The wafer is preferably scanned by the laser spot with a field size of about 40× about 40 m to about 12.5× about 4 mm. Suitable fluence to debond the substrates is from about 100 mJ/cm$^2$ to about 1,300 mJ/cm$^2$, and preferably from about 150 mJ/cm$^2$ to about 800 mJ/cm$^2$. Suitable power to debond the substrates is from about 2 W to about 6 W, and preferably from about 3 W to about 4 W.

After laser exposure, the substrates 12 and 24 will readily separate. After separation, any remaining bonding layer 20 can be removed with a plasma etch or a solvent capable of dissolving the bonding layer 20. A preferred cleaning method involves the use of a mildly acidic solution. In this instance, the debonded substrates 12 and/or 24 are soaked or spun cleaned with the solution for a time of from about 30 seconds to about 20 minutes, preferably from about 1 minute to 10 minutes. This cleaning solution preferably comprises, consists essentially of, or even consists of, ketone-based solvents, such as cylcopentanone, cyclohexanone, acetophenone, and mixtures thereof, but other water-miscible solvents are also acceptable. The solvent is preferably present in the cleaning solution from about 1% to about 99% by weight, more preferably from about 70% to about 95% by weight, based upon the total weight of the cleaning solution taken as 100% by weight. When used, water is preferably present in the cleaning solution from about 0.1% to about 99% by weight, more preferably from about 1% to about 20% by weight, based upon the total weight of the cleaning solution taken as 100% by weight. The cleaning solution also comprises one or more acids, with preferred acids being weaker acids such as acetic acid, butyric acid, citric acid, phosphoric acid, benzoic acid, and mixtures thereof. The acid is preferably present in the cleaning solution from about 0.1% to about 30% by weight, but more preferably from about 1% to about 15% by weight, based upon the total weight of the cleaning solution taken as 100% by weight. It will be appreciated that stronger acids could be used in lower percentages, provided that the cleaning solution does not damage features on the device wafer.

In the above embodiments, laser-releasable bonding layer 20 is shown on a first substrate 12 that is a device wafer. It will be appreciated that this substrate/layer scheme could be reversed. That is, bonding layer 20 could be formed on second substrate 24 (i.e., the carrier wafer). The same compositions and processing conditions would apply to this embodiment as those described above.

In a particularly preferred embodiment, bonding layer 20 is the only layer between substrates 12 and 24, as shown in FIG. 1. However, it will be appreciated that in alternative embodiments, bonding layer 20 could be used with additional bonding materials, structural support layers, lamination aid layers, tie layers (for adhesion to initial substrate), contamination control layers, and cleaning layers. Preferred structures and application techniques will be dictated by application and process flow.

Additional advantages of the various embodiments will be apparent to those skilled in the art upon review of the disclosure herein and the working examples below. It will be appreciated that the various embodiments described herein are not necessarily mutually exclusive unless otherwise indicated herein. For example, a feature described or depicted in one embodiment may also be included in other embodiments but is not necessarily included. Thus, the present disclosure encompasses a variety of combinations and/or integrations of the specific embodiments described herein.

As used herein, the phrase "and/or," when used in a list of two or more items, means that any one of the listed items can be employed by itself or any combination of two or more of the listed items can be employed. For example, if a composition is described as containing or excluding components A, B, and/or C, the composition can contain or exclude A alone; B alone; C alone; A and B in combination; A and C in combination; B and C in combination; or A, B, and C in combination.

The present description also uses numerical ranges to quantify certain parameters relating to various embodiments. It should be understood that when numerical ranges are provided, such ranges are to be construed as providing literal support for claim limitations that only recite the lower value of the range as well as claim limitations that only recite the upper value of the range. For example, a disclosed numerical range of about 10 to about 100 provides literal support for a claim reciting "greater than about 10" (with no upper bounds) and a claim reciting "less than about 100" (with no lower bounds).

EXAMPLES

The following examples set forth methods in accordance with the disclosure. It is to be understood, however, that these examples are provided by way of illustration and nothing therein should be taken as a limitation upon the overall scope.

Example 1

Preparation of Polyazomethine Solution 1

In this Example, 41.19 grams (10.91%) of terephthalaldehyde (TCI, Portland, OR), 0.85 grams (0.22%) of butyric acid (Sigma Aldrich, St. Louis, MO), and 108.05 grams (36.32%) of PGMEA (Fujifilm, Suzhou, China) were added to a reaction vessel with a Dean Stark trap and condenser attached to the Dean Stark trap. The trap was filled with PGMEA to form a separation between the water generated during the reaction and the PGMEA. Nitrogen was pumped into the reaction vessel to form an inert atmosphere. The reaction was heated to 120° C. Once all the terephthalaldehyde was dissolved, 27.87 grams (7.38%) of 9,9-bis(4-aminophenyl)fluorene (JFE Chemical Corporation, Tokyo, Japan) were added and allowed to react for 20-60 minutes until the generation of water slowed to a stop. Next, 62.78 grams (16.63%) of 1,3-bis(aminopropyl)tetramethyldisiloxane (Alfa Aesar, Ward Hill, MA), were added with 136.84 grams (28.54%) of PGMEA through an addition funnel. The solution was heated to 150° C. (the reflux temperature of PGMEA) and allowed to react for 6-8 hours. An orange-pink moderately viscous solution was obtained.

Example 2

Bonding Property Testing

Figure 2:
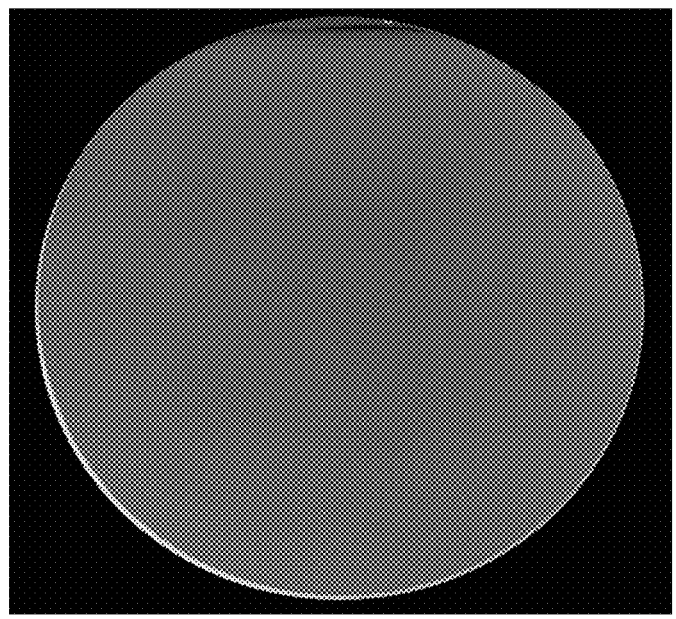
FIG. 2 is a photograph of a wafer pair after bonding as described in Example 2.

The material from Example 1 was spin coated onto an 8" glass wafer at a spin speed of 850 rpm for 45 seconds with a ramp of 500 rpm/s and baked on a hot plate at 120° C. for 3 minutes and then 180° C. for 5 minutes to yield a 20 μm coat. The coated, baked wafer was then bonded to an 8" silicon wafer. The substrates were then bonded using an EVG 510 bonder using a bond force of 2200 N, a bond temperature of 145° C., and a bond time of 3 minutes. The bonded pair exhibited good bond quality with no voiding after bonding. A photograph of the bonded pair is shown in FIG. 2.

Example 3

Laser Debond Test at 308 nm

Figure 3:
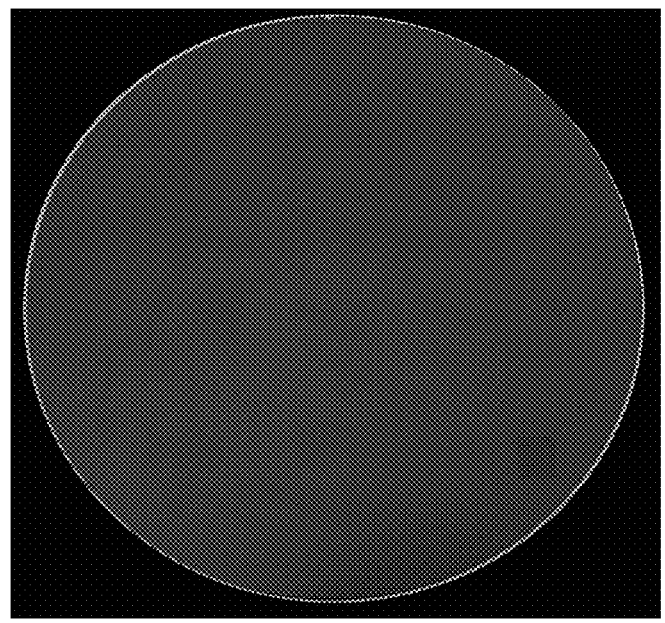
FIG. 3 is a photograph of a silicon wafer after laser debonding as described in Example 3.

Wafers were bonded as shown in Example 2. The bonded pair was then debonded using a 308 nm laser debonder at SUSS MicroTec in Corona, CA The wafers were able to be debonded with a fluence of 275 mJ/cm$^2$ and required minimal debond force to separate the wafer pairs. FIG. 3 shows a photograph of the silicon wafer after debond at 308 nm.

Example 4

Laser Debond Test at 355 nm

Figure 4:
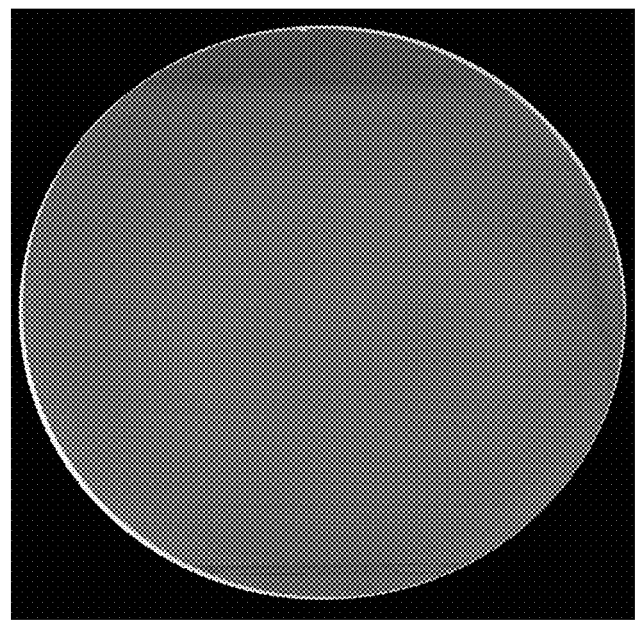
FIG. 4 is a photograph of a silicon wafer after laser debonding as described in Example 4.

Wafers were bonded as in Example 2 and then were laser debonded using a 355 nm laser at Kingyoup in Taipei, Taiwan. Table 1 shows the debonding parameters. FIG. 4 shows a photograph of the silicon wafer after debond at 355 nm.

TABLE 1

Kingyoup 355 nm Laser Debond Data

| Power (W) | Scan Speed (m/s) | Line Pitch (μm) | Scan Time (s) | Result |
|---|---|---|---|---|
| 4 | 4.7 | 94 | 71.1 | Successful debond, high degree of material carbonization |
| 3 | 3.3 | 66 | 144.2 | Successful debond, lower degree of carbonization |
| 4 | 5.8 | 116 | 46.7 | Successful debond, high degree of carbonization |

Example 5 n & k Measurements of Example 1 Material

Figure 5:
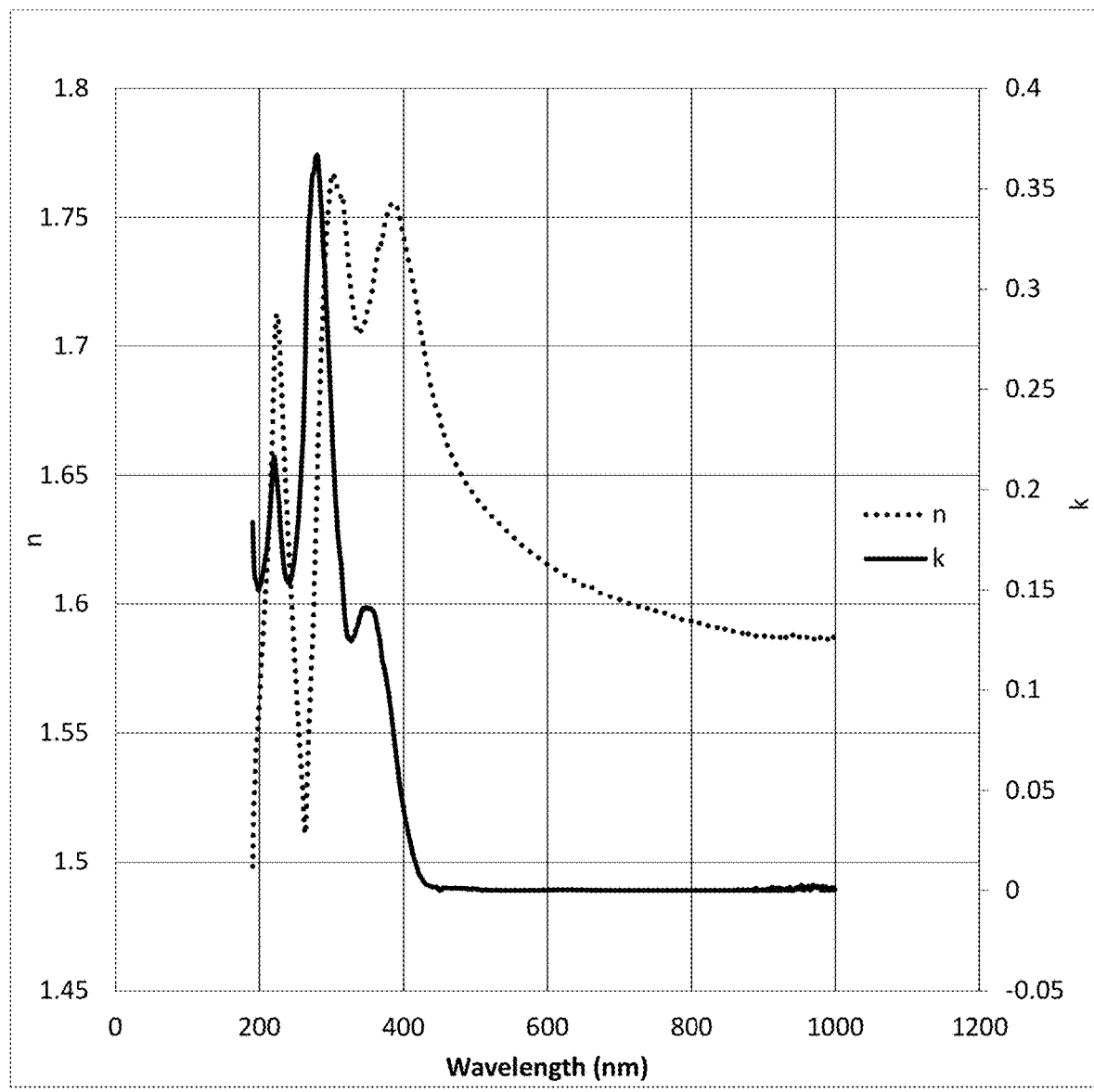
FIG. 5 is a graph showing the n & k data of the material from Example 1.

The material from Example 1 was spin coated onto a 4-inch silicon wafer at a spin speed of 1,500 rpm for 60 seconds with a ramp of 1,500 rpm/s and baked on a hot plate at 120° C. for 3 minutes and then 180° C. for 5 minutes to yield a 200-nm coat. The optical parameters were then measured using a VASE M2000. The full spectrum of n and k is shown in FIG. 5 at targeted wavelengths.

Example 6

Preparation of Polyazomethine Solution 2

In this Example, 20.12 grams (11.66%) of terephthalaldehyde, 70.59 grams (40.92%) of PGMEA, and 17.90 grams (10.37%) of 1,3-bis(aminopropyl)tetramethyldisiloxane (Alfa Aesar, Ward Hill, MA) were added to a reaction vessel with a Dean Stark trap and condenser attached to the Dean Stark trap. The trap was filled with PGMEA to form a separation between the water generated during the reaction and the PGMEA. Nitrogen was pumped into the reaction vessel to form an inert atmosphere. The solution was allowed to react at 25° C. for 15-20 mins, and then the reaction was heated to 120° C. and was reacted for 1-2 hours, or until the generation of water slowed to a stop. Once all the water was removed 22.36 grams (12.96%) of 4,4'-methylenebis(2,6-diethylaniline) (TCI, Portland, OR) and 41.53 grams (24.06%) of PGMEA was added to solution. The solution continued to react at 120° C. and was allowed to react for 6-8 hours. The solution obtained was a dark yellow amber color and had moderate viscosity.

Example 7 n & k Measurements of Example 6 Material

Figure 6:
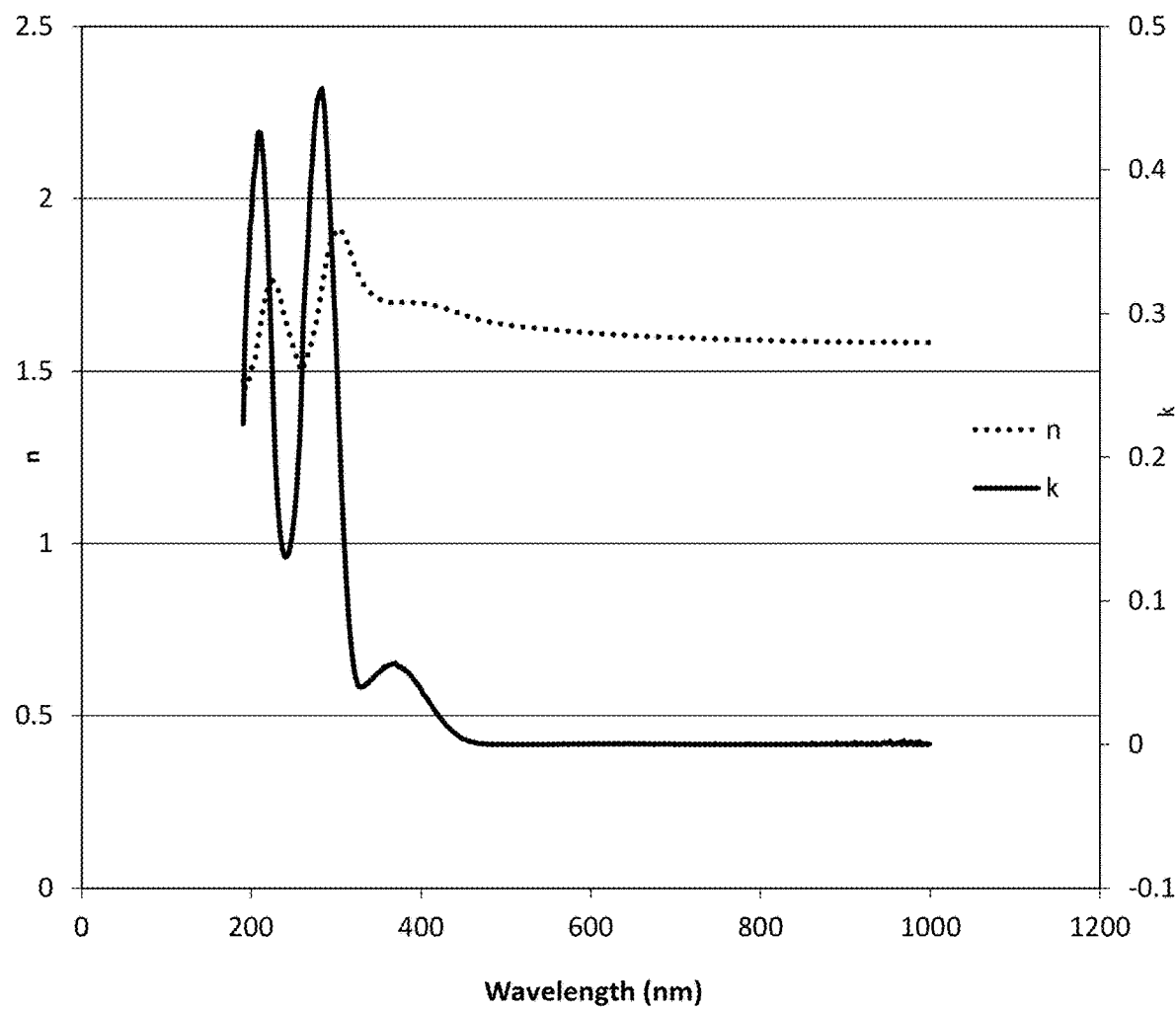
FIG. 6 is a graph showing the n & k data of the material from Example 6.

The material from Example 6 was spin coated onto a 4-inch silicon wafer at a spin speed of 1,500 rpm for 60 seconds with a ramp of 1,500 rpm/s and baked on a hot plate at 120° C. for 3 minutes and then 180° C. for 5 minutes to yield a 200-nm coat. The optical parameters were then measured using a VASE M2000. The full spectrum of n and k is shown in FIG. 6 at targeted wavelengths.

Example 8

Preparation of Polyazomethine Solution 3

In this Example, 16.91 grams (9.85%) of terephthalaldehyde, 74.98 grams (43.68%) of PGMEA, and 23.49 grams (13.69%) of 1,3-bis(aminopropyl)tetramethyldisiloxane (Alfa Aesar, Ward Hill, MA) were added to a reaction vessel with a Dean Stark trap and condenser attached to the Dean Stark trap. The trap was filled with PGMEA to form a separation between the water generated during the reaction and the PGMEA. Nitrogen was pumped into the reaction vessel to form an inert atmosphere. The solution was allowed to react at 25° C. for 15-20 mins, and then the reaction was heated to 120° C. and was reacted for 1-2 hours, or until the generation of water slowed to a stop. Once all the water was removed, 19.68 grams (11.47%) of bis[4-(3-aminophenoxy)phenyl] sulfone (Alfa Aesar, Ward Hill, MA) and 36.57 grams (21.31%) of PGMEA, was added to the solution. The solution continued to react at 120° C. and was allowed to react for 6-8 hours. The solution obtained was a brown-amber color and had moderate viscosity.

Example 9 n & k Measurements of Example 8 Material

Figure 7:
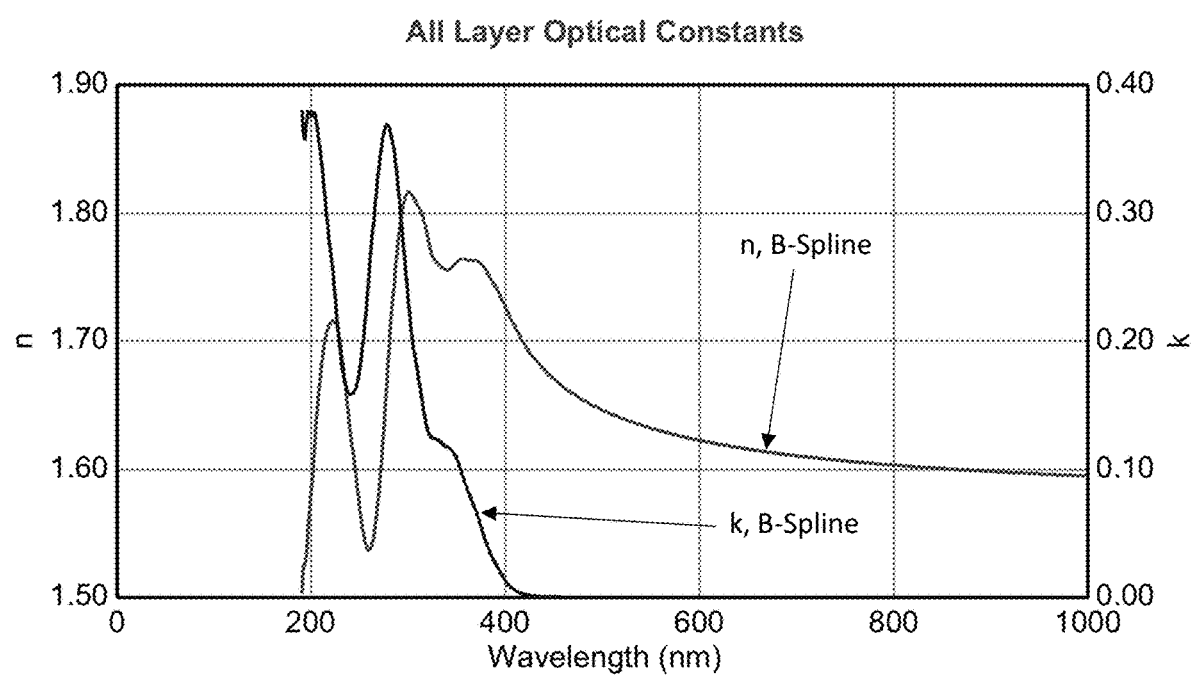
FIG. 7 is a graph showing the n & k data of the material from Example 8.

The material from Example 8 was spin coated onto a 4-inch silicon wafer at a spin speed of 1,500 rpm for 60 seconds with a ramp of 1,500 rpm/s and baked on a hot plate at 120° C. for 3 minutes and then 180° C. for 5 minutes to yield a 200-nm coat. The optical parameters were then measured using a VASE M2000. The full spectrum of n and k is shown in FIG. 7 at targeted wavelengths.

Example 10

Preparation of Polyazomethine Solution 4

In this Example, 17.66 grams (6.51%) of terephthalaldehyde, 75.844 grams (27.92%) of anisole (Sigma Aldrich, St. Louis, MO), and 23.49 grams (13.69%) of diethylene glycol bis(3-aminopropyl) ether (TCI, Portland, OR) were added to a reaction vessel with a Dean Stark trap and condenser attached to the Dean Stark trap. The trap was filled with anisole to form a separation between the water generated during the reaction and the anisole. Nitrogen was pumped into the reaction vessel to form an inert atmosphere. The solution was allowed to react at 25° C. for 15-20 minutes, and then the reaction was heated to 120° C. and was reacted for 1-2 hours, or until the generation of water slowed to a stop. Once all the water was removed, 12.192 grams (4.49%) of 9,9-bis(4-aminophenyl)fluorene and 22.615 grams (8.33%) of anisole were added to the solution. The solution was allowed to react at a 120° C. for 15-30 minutes. Once the time passed, 4.602 grams (1.70%) of Neximid 300 (Nexam Chemical, Sweden) and 8.541 grams (3.15%) of anisole were added to the solution. The solution continued to react at 120° C. and was allowed to react for 4.5 hours. The solution obtained was a brown-red color and had moderate viscosity.

Example 11 n & k Measurements of Example 10 Material

Figure 8:
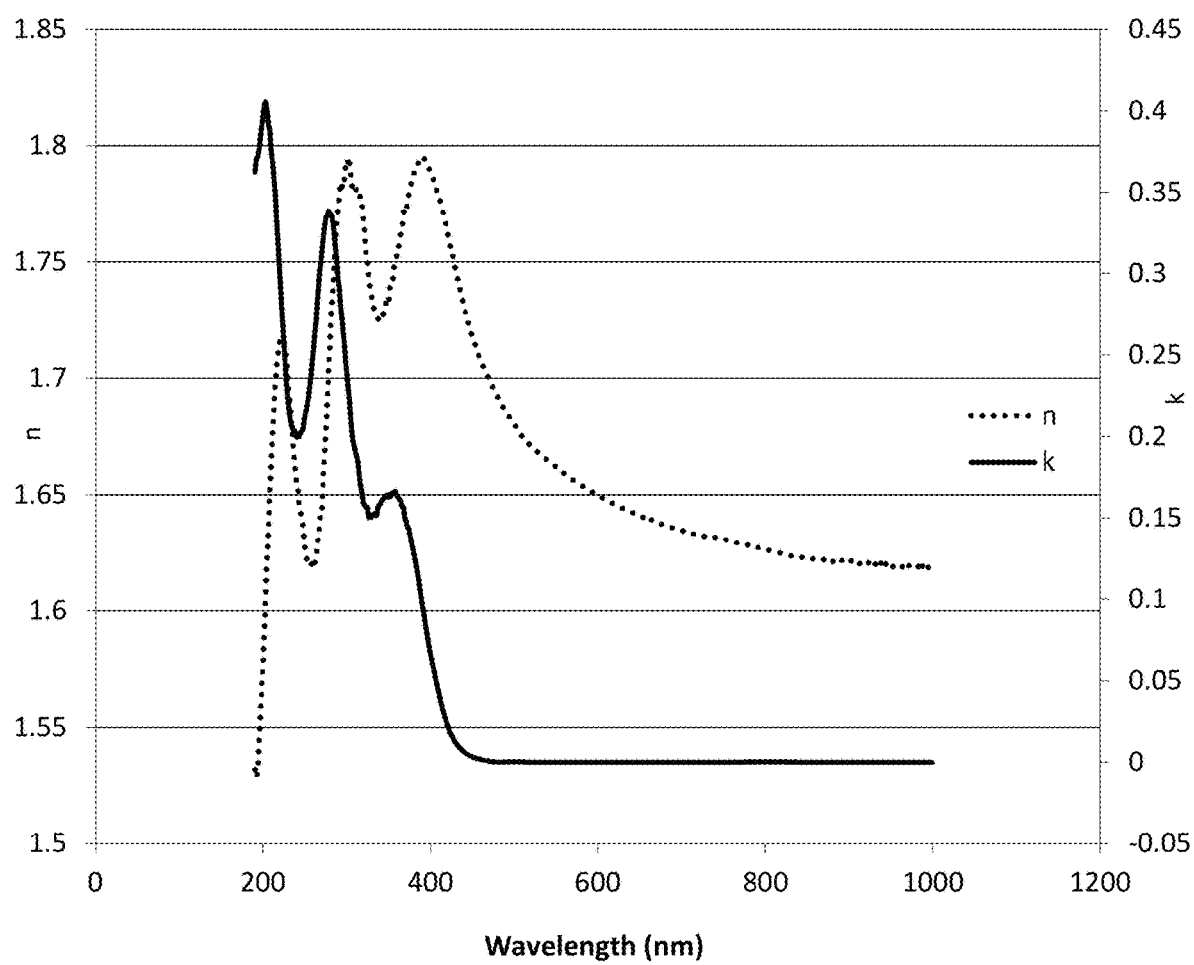
FIG. 8 is a graph showing the n & k data of the material from Example 10.

The material from Example 10 was spin coated onto a 4-inch silicon wafer at a spin speed of 1,500 rpm for 60 seconds with a ramp of 1,500 rpm/s and baked on a hot plate at 120° C. for 3 minutes and then 180° C. for 5 minutes to yield a 200-nm coat. The optical parameters were then measured using a VASE M2000. The full spectrum of n and k is shown in FIG. 8 at targeted wavelengths.

Example 12

Preparation of Polyazomethine Solution 5

In this Example, 18.03 grams (12.24%) of terephthalaldehyde, 82.194 grams (55.8%) of anisole (Sigma Aldrich, St. Louis, MO), and 26.22 grams (17.8%) of diethylene glycol bis(3-aminopropyl) ether (TCI, Portland, OR) were added to a reaction vessel with a Dean Stark trap and condenser attached to the Dean Stark trap. The trap was filled with anisole to form a separation between the water generated during the reaction and the anisole. Nitrogen was pumped into the reaction vessel to form an inert atmosphere. The solution was allowed to react at 25° C. for 15-20 minutes, and then the reaction was heated to 120° C. and was reacted for 1-2 hours, or until the generation of water slowed to a stop. Once all the water was removed, 7.32 grams (4.97%) of 9,9-bis(4-aminophenyl)fluorene and 13.56 grams (9.20%) of anisole were added to the solution. The solution continued to react at 120° C. and was allowed to react for 5-8 hours. The solution obtained was light yellow in color and had moderate viscosity.

Example 13 n & k Measurements of Example 12 Material

Figure 9:
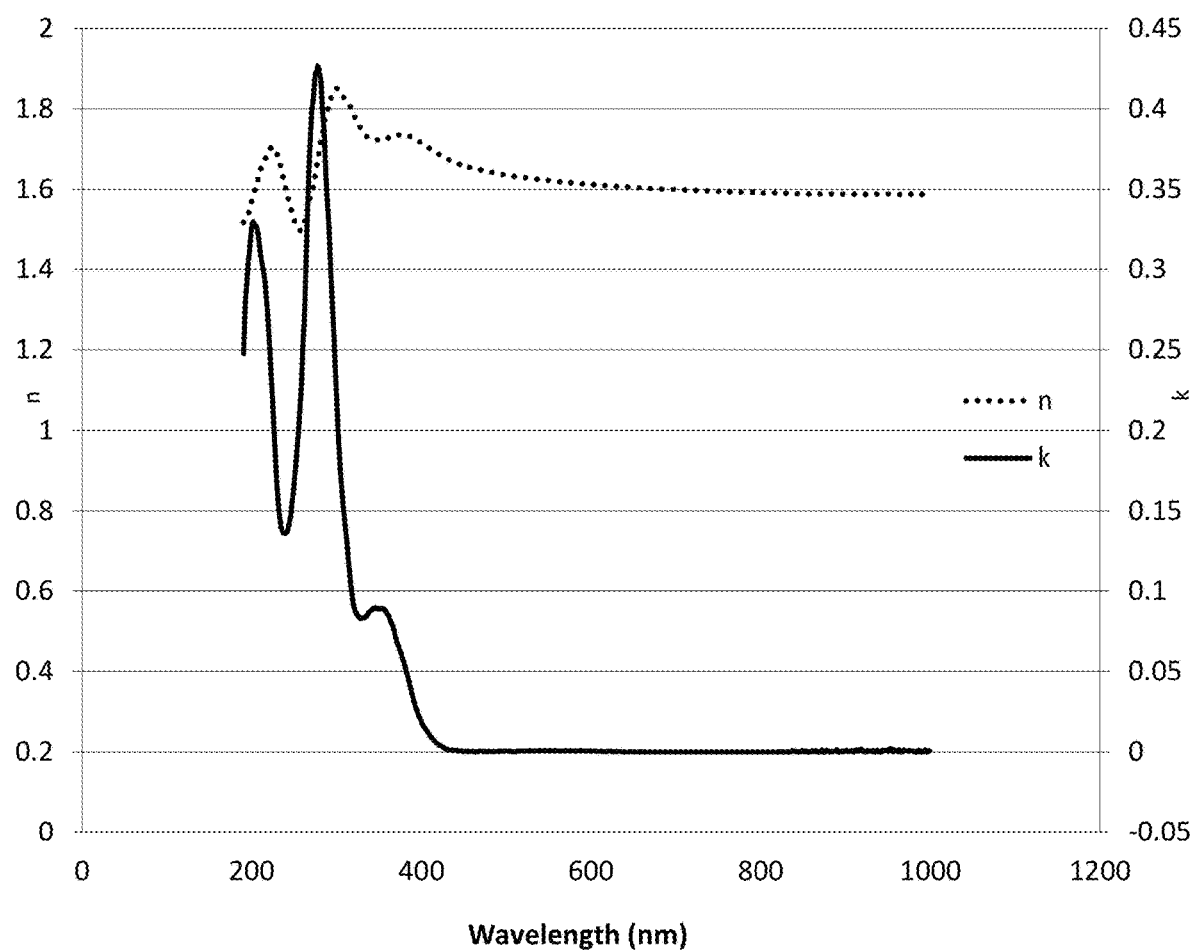
FIG. 9 is a graph showing the n & k data of the material from Example 12.

The material from Example 12 was spin coated onto a 4-inch silicon wafer at a spin speed of 1,500 rpm for 60 seconds with a ramp of 1,500 rpm/s and baked on a hot plate at 120° C. for 3 minutes and then 180° C. for 5 minutes to yield a 200-nm coat. The optical parameters were then measured using a VASE M2000. The full spectrum of n and k is shown in FIG. 9 at targeted wavelengths.

Example 14

Preparation of Polyazomethine Solution 6

In this Example, 18.02 grams (11.82%) of terephthalaldehyde, 76.43 grams (50.13%) of anisole (Sigma Aldrich, St. Louis, MO), and 23.13 grams (15.17%) of diethylene glycol bis(3-aminopropyl) ether (TCI, Portland, OR) were added to a reaction vessel with a Dean Stark trap and condenser attached to the Dean Stark trap. The trap was filled with anisole to form a separation between the water generated during the reaction and the anisole. Nitrogen was pumped into the reaction vessel to form an inert atmosphere. The solution was allowed to react at 25° C. for 15-20 minutes, and then the reaction was heated to 120° C. and was reacted for 1-2 hours, or until the generation of water slowed to a stop. Once all the water was removed, 12.19 grams (8.00%) of 9,9-bis(4-aminophenyl)fluorene and 22.68 grams (14.88%) of anisole were added to the solution. The solution continued to react at 120° C. and was allowed to react for 5-8 hours. The solution obtained was a light yellow in color and had moderate viscosity.

Example 15 n & k Measurements of Example 14 Material

Figure 10:
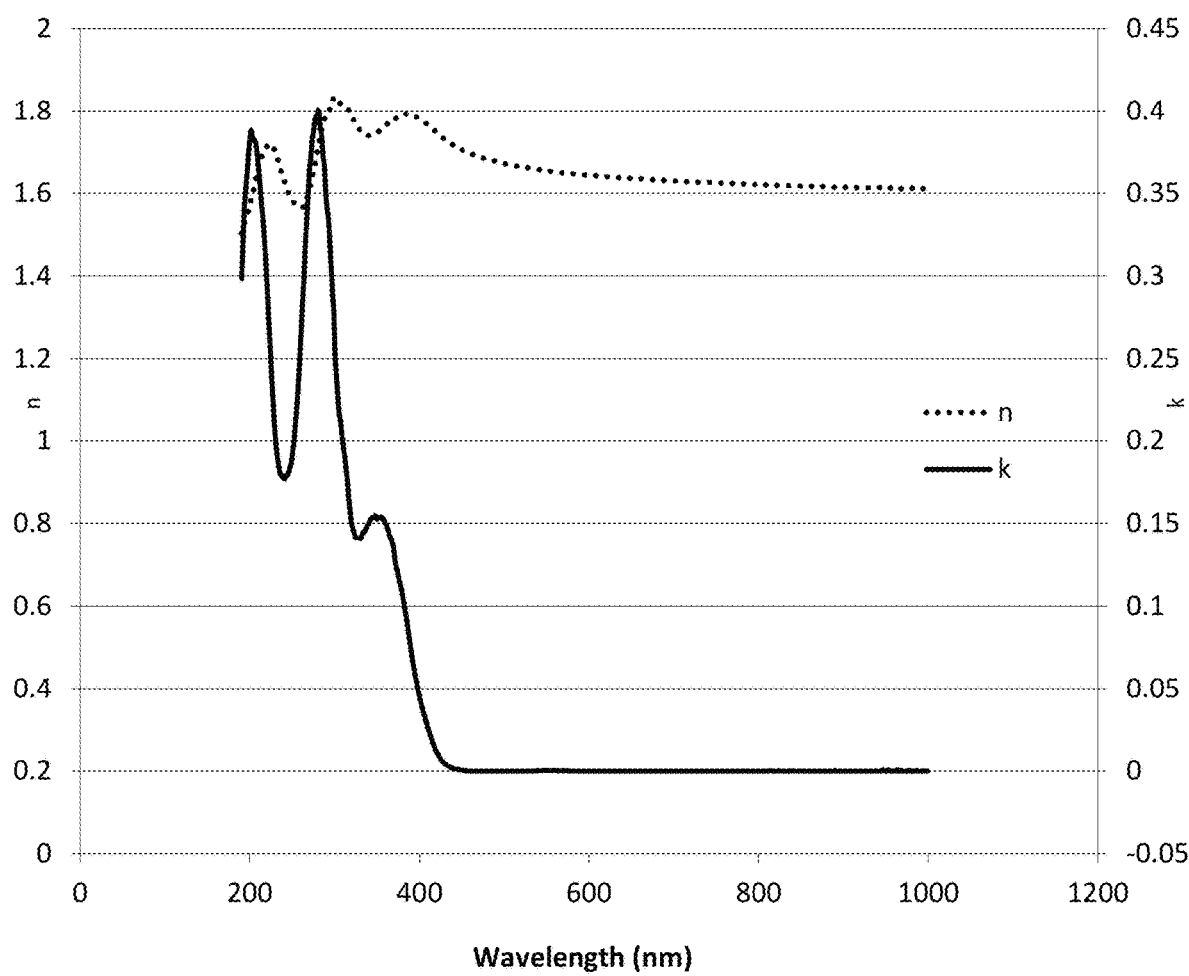
FIG. 10 is a graph showing the n & k data of the material from Example 14.

The material from Example 14 was spin coated onto a 4-inch silicon wafer at a spin speed of 1,500 rpm for 60 seconds with a ramp of 1,500 rpm/s and baked on a hot plate at 120° C. for 3 minutes and then 180° C. for 5 minutes to yield a 200-nm coat. The optical parameters were then measured using a VASE M2000. The full spectrum of n and k is shown in FIG. 10 at targeted wavelengths.

Example 16

Preparation of Polyazomethine Solution 7

In this Example, 88.21 grams (11.44%) of terephthalaldehyde, 346.01 grams (44.87%) of anisole (Sigma Aldrich, St. Louis, MO), and 98.04 grams (12.71%) of diethylene glycol bis(3-aminopropyl) ether (TCI, Portland, OR) were added to a reaction vessel with a Dean Stark trap and condenser attached to the Dean Stark trap. The trap was filled with anisole to form a separation between the water generated during the reaction and the anisole. Nitrogen was pumped into the reaction vessel to form an inert atmosphere. The solution was allowed to react at 25° C. for 15-20 minutes, and then the reaction was heated to 120° C. and was reacted for 1-2 hours, or until the generation of water slowed to a stop. Once all the water was removed, 83.52 grams (10.83%) of 9,9-bis(4-aminophenyl)fluorene and 155.30 grams (20.14%) of anisole were added to the solution. The solution continued to react at 120° C. and was allowed to react for 5-8 hours. The solution obtained was yellow in color and had moderate viscosity.

Example 17 n & k Measurements of Example 16 Material

Figure 11:
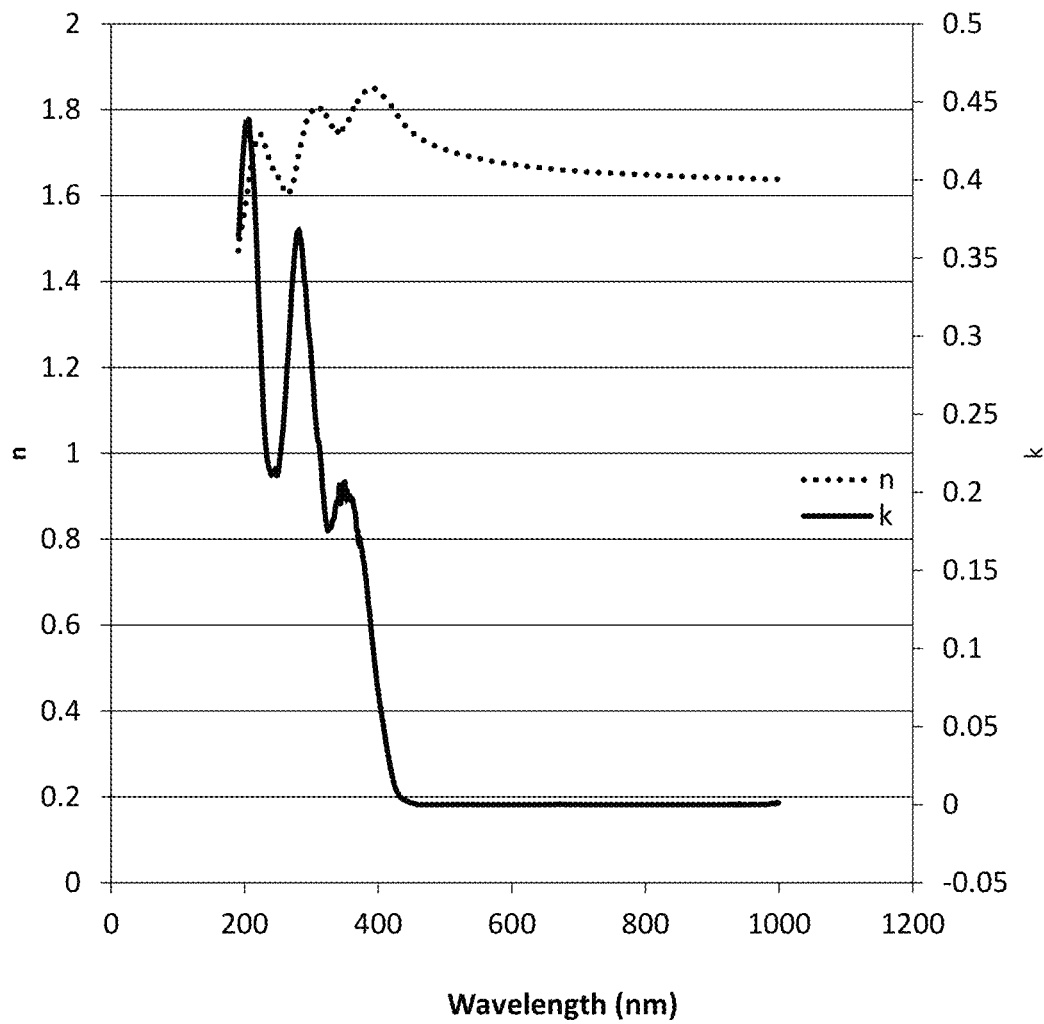
FIG. 11 is a graph showing the n & k data of the material from Example 16.

The material from Example 16 was spin coated onto a 4-inch silicon wafer at a spin speed of 1,500 rpm for 60 seconds with a ramp of 1,500 rpm/s and baked on a hot plate at 120° C. for 3 minutes and then 180° C. for 5 minutes to yield a 200-nm coat. The optical parameters were then measured using a VASE M2000. The full spectrum of n and k is shown in FIG. 11 at targeted wavelengths.

Example 18

Preparation of Polyazomethine Solution 8

In this Example, 16.93 grams (10.30%) of terephthalaldehyde, and 31.62 grams (19.24%) of anisole (Sigma Aldrich, St. Louis, MO) were added to a reaction vessel with a Dean Stark trap and condenser attached to the Dean Stark trap. The trap was filled with anisole to form a separation between the water generated during the reaction and the anisole. Nitrogen was pumped into the reaction vessel to form an inert atmosphere. 23.033 grams (14.02%) of diethylene glycol bis(3-aminopropyl) ether (TCI, Portland, OR) and 42.92 grams (26.12%) of anisole were mixed together and then drawn into a 60 mL syringe, which was mounted to a syringe pump. The solution was heated to 120° C. and the diethylene glycol bis(3-aminopropyl) ether anisole solution was added to the reaction via the syringe pump at a flow rate of 1 mL/min and was reacted for 1-2 hours, or until the generation of water slowed to a stop. Once all the water was removed, 5.24 grams (3.19%) of 5-methyl-2-phenyl-2-hexenal (Sigma Aldrich, St. Louis, MO) was added and allowed to react for 20-30 minutes. Then 12.19 grams (7.42%) of 9,9-bis(4-aminophenyl)fluorene and 32.39 grams (19.71%) of anisole were added to the solution. The solution continued to react at 120° C. and was allowed to react for 10 hours. The solution obtained was amber-yellow in color and had moderate viscosity.

Example 19 n & k Measurements of Example 18 Material

Figure 12:
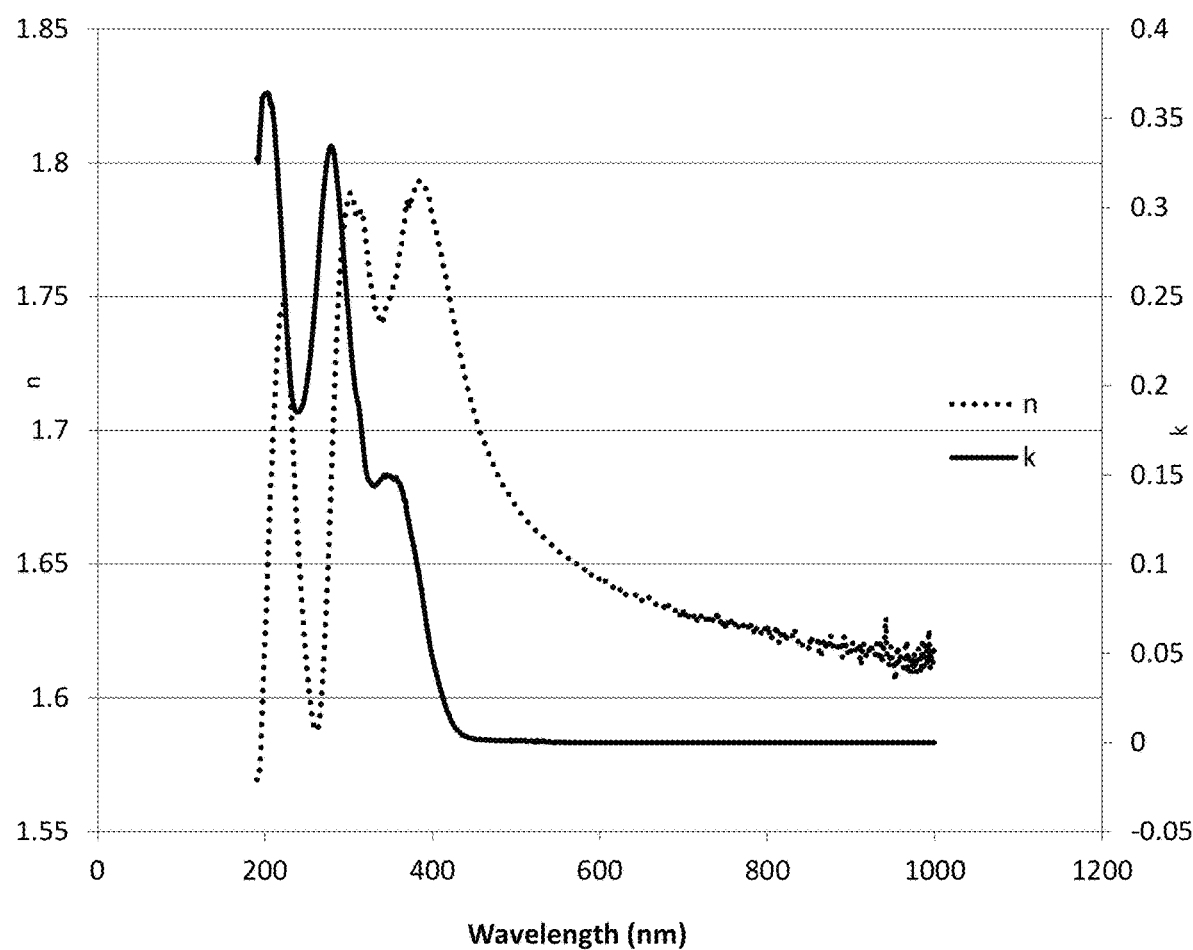
FIG. 12 is a graph showing the n & k data of the material from Example 18.

The material from Example 18 was spin coated onto a 4" silicon wafer at a spin speed of 1,500 rpm for 60 seconds with a ramp of 1500 rpm/s and baked on a hot plate at 120° C. for 3 minutes and then 180° C. for 5 minutes to yield a 200-nm coat. The optical parameters were then measured using a VASE M2000. The full spectrum of n and k is shown in FIG. 12 at targeted wavelengths.

Example 20

Preparation of Polyazomethine Solution 9

In this Example, 14.172 grams (11.44%) of terephthalaldehyde, 57.81 grams (44.83%) of anisole (Sigma Aldrich, St. Louis, MO), and 16.963 grams (13.15%) of diethylene glycol bis(3-aminopropyl) ether (TCI, Portland, OR) were added to a reaction vessel with a Dean Stark trap and condenser attached to the Dean Stark trap. The trap was filled with anisole to form a separation between the water generated during the reaction and the anisole. Nitrogen was pumped into the reaction vessel to form an inert atmosphere. The solution was allowed to react at 25° C. for 15-20 minutes, and then the reaction was heated to 120° C. and was reacted for 1-2 hours, or until the generation of water slowed to a stop. Once all the water was removed, 13.54 grams (10.50%) of 2,2-bis[4-(4-aminophenoxy)phenyl]propane (TCI, Portland, OR) and 26.03 grams (20.18%) of anisole were added to the solution. The solution continued to react at 120° C. and was allowed to react for 5 hours. After the 5 hours, 0.464 grams (0.36%) of trans-2-pentenal (Sigma Aldrich, St. Louis, MO) was added to the solution and allowed to react for 30 minutes. The solution obtained was red in color and had moderate viscosity.

Example 21

Preparation of Polyazomethine Solution 10

In this Example, 20.12 grams (11.37%) of terephthalaldehyde, 87.22 grams (49.31%) of PGMEA, and 26.85 grams (15.18%) of 1,3-bis(aminopropyl)tetramethyldisiloxane (Alfa Aesar, Ward Hill, MA) were added to a reaction vessel with a Dean Stark trap and condenser attached to the Dean Stark trap. The trap was filled with PGMEA to form a separation between the water generated during the reaction and the PGMEA. Nitrogen was pumped into the reaction vessel to form an inert atmosphere. The solution was allowed to react at 25° C. for 15-20 mins, and then the reaction was heated to 120° C. and was reacted for 1-2 hours, or until the generation of water slowed to a stop. Once all the water was removed, 14.78 grams (8.35%) of 2,2-bis [4-(4-aminophenoxy)phenyl]propane (TCI, Portland, OR) and 27.94 grams (15.79%) of PGMEA, was added to the solution. The solution continued to react at 120° C. and was allowed to react for 6-8 hours. The obtained solution was a pinkish-yellow color but precipitated into a yellow powder upon cooling, with poor solubility.

Example 22

Preparation of Polyazomethine Solution 11

In this Example, 21.43 grams (12.61%) of terephthaldehyde, 93.02 grams (54.72%) of PGMEA, and 28.63 grams (16.84%) of 1,3-bis(aminopropyl)tetramethyldisiloxane (Alfa Aesar, Ward Hill, MA) were added to a reaction vessel with a Dean Stark trap and condenser attached to the Dean Stark trap. The trap was filled with PGMEA to form a separation between the water generated during the reaction and the PGMEA. Nitrogen was pumped into the reaction vessel to form an inert atmosphere. The solution was allowed to react at 25° C. for 15-20 mins, and then the reaction was heated to 120° C. and was reacted for 1-2 hours, or until the generation of water slowed to a stop. Once all the water was removed, 9.42 grams (8.35%) of o-dianisidine (TCI, Portland, OR) and 17.47 grams (10.28%) of PGMEA, were added to solution. The solution continued to react at 120° C. and was allowed to react for 6-8 hours. Solution precipitated out into a dark red, insoluble, powder-like substance.

Example 23

Preparation of Polyazomethine Solution 12

In this Example, 21.47 grams (11.83%) of terephthalaldehyde, and 72.32 grams (39.85%) of PGMEA were added to a reaction vessel with a Dean Stark trap and condenser attached to the Dean Stark trap. The trap was filled with PGMEA to form a separation between the water generated during the reaction and PGMEA. Nitrogen was pumped into the reaction vessel to form an inert atmosphere. The reaction was heated to 120° C. Once all the terephthalaldehyde was dissolved, 13.22 grams (7.29%) of 4,4'-(1,3-phenylenediisopropylidene)bisaniline (Sigma-Aldrich, St. Louis, MO) were added and allowed to react for 20-60 minutes until the generation of water slowed to a stop. 28.66 grams (15.80%) of 1,3-bis(aminopropyl)tetramethyldisiloxane (Alfa Aesar, Ward Hill, MA), were then added with 46.79 grams (25.23%) of PGMEA through an addition funnel. The solution was heated to 150° C. (the reflux temperature of PGMEA) and allowed to react for 10-14 hours. The solution precipitated during reaction into a yellow-greenish powder with low solubility.

We claim:
1. A temporary bonding method comprising:
   providing a stack comprising:

a first substrate having a back surface and a front surface;
a bonding layer adjacent said front surface and comprising a polyazomethine; and
a second substrate having a first surface adjacent said bonding layer; and
exposing said bonding layer to laser energy so as to facilitate separation of said first and second substrates.

2. The method of claim 1, wherein said polyazomethine comprises a copolymer of a first monomer comprising an aldehyde and/or ketone group and a second monomer comprising an amine.

3. The method of claim 2, wherein said polyazomethine comprises a copolymer of a dialdehyde, an aromatic diamine, and an aliphatic diamine.

4. The method of claim 2, wherein said first monomer is chosen from terephthalaldehyde, 1,3-bis(4-formylphenoxy)-2-hydroxypropane ["4EPIDA"], isophthalaldehyde, {4-[(p-formylbenzoyloxy)methyl]cyclohexyl}methyl p-formylbenzoate, 2-(p-formylbenzoyloxy)ethyl p-formylbenzoate, 2-[2-(p-formylbenzoyloxy)ethoxy]ethyl p-formylbenzoate, 2-{2-[2-(p-formylbenzoyloxy)ethoxy]ethoxy}ethyl p-formylbenzoate, 2-(2-{2-[2-(p-formylbenzoyloxy)ethoxy]ethoxy}ethyl) p-formylbenzoate, 4-(p-formylbenzoyloxy)cyclohexyl p-formylbenzoate, 3-(p-formylbenzoyloxy) cyclohexyl p-formylbenzoate, {4-[(p-formylbenzoyloxy)methyl]tricyclo[5.2.1.0$^{2,6}$]dec-8-yl}methyl p-formylbenzoate, p-{p-[p-(p-formylphenoxy)phenylsulfonyl]phenoxy}benzaldehyde, 4-{p-[p-(4-formyl-2-methoxyphenoxy)phenylsulfonyl]phenoxy}-3-anisaldehyde, (E)-5-(p-formylbenzoyloxy)-2-pentenyl p-formylbenzoate, 3-(allyloxy)-2-(p-formylbenzoyloxy)propyl p-formylbenzoate, 1,4-diacetylbenzene, (E)-5-(p-acetylbenzoyloxy)-2-pentenyl p-acetylbenzoate, 2-(p-acetylbenzoyloxy)-3-(allyloxy)propyl p-acetylbenzoate, 1-(4-{p-[p-(4-acetyl-2-methoxyphenoxy)phenylsulfonyl]phenoxy}-3-methoxyphenyl)-1-ethanone, 1-(p-{p-[p-(p-acetylphenoxy)phenylsulfonyl]phenoxy}phenyl)-1-ethanone, 3-(p-acetylbenzoyloxy)cyclohexyl p-acetylbenzoate, {4-[(p-acetylbenzoyloxy)methyl]tricyclo[5.2.1.0$^{2,6}$]dec-8-yl}methyl p-acetylbenzoate, 2-(2-{2-[2-(p-acetylbenzoyloxy)ethoxy]ethoxy}ethoxy)ethyl p-acetylbenzoate, 2-{2-[2-(p-acetylbenzoyloxy)ethoxy]ethoxy}ethyl p-acetylbenzoate, 2-[2-(p-acetylbenzoyloxy)ethoxy]ethyl p-acetylbenzoate, 2-(p-acetylbenzoyloxy)ethyl p-acetylbenzoate, {4-[(p-acetylbenzoyloxy)methyl]cyclohexyl}methyl p-acetylbenzoate, and combinations thereof.

5. The method of claim 2, wherein said second monomer is chosen from 1,3-bis(aminopropyl)tetramethyldisiloxane, aminopropyl-terminated polydimethylsiloxane, 4,4'-methylenebis(2-methylcyclohexylamine, 2-methyl-1,5-diaminopentane, isophoronediamine, 1,12-diaminododecane, 1,7-diaminoheptane, 1,10-diaminodecane, 1,4-butanediol bis(3-aminopropyl) ether, 1,2-bis(2-aminoethoxy)ethane, diethylene glycol bis(3-aminopropyl) ether, 1,6-diaminohexane, 2,2-dimethyl-1,3-propanediamine, bis(aminomethyl)norbornane, 4,4'-methylenebis(cyclohexylamine), 1,3-bis(aminomethyl)cyclohexane, 1,4-bis(aminomethyl)cyclohexane, 1,3-cyclohexanediamine, 1,4-cyclohexanediamine, 9,9-bis(4-aminophenyl)fluorene, 4,4'-methylenebis(2,6-diethylaniline), 2,2-bis[4-(4-aminophenoxy)phenyl]propane, 4,4'-(1,3-phenylenediisopropylidene)bisaniline, 4-aminophenyl sulfone, 9,9-bis(4-aminophenyl)fluorene, bis[4-(3-aminophenoxy)phenyl] sulfone, o-dianisidine, 1,5-diaminonaphthalene, m-xylylenediamine, p-xylylenediamine, 4,4'-diaminodiphenyl ether, bis(3-aminophenyl) sulfone, 1,3-phenylenediamine, 4,4'-diaminodiphenylmethane, 4,4'-methylenebis(2-chloroaniline), α,α'-bis(4-aminophenyl)-1,4-diisopropylbenzene, 1,4-phenylenediamine, 2,2-bis(4-aminophenyl)hexafluoropropane, 2,2'-bis(trifluoromethyl)benzidine, 2,7-diaminofluorene, 3,4'-diaminodiphenylmethane, 3,3',5,5'-tetramethylbenzidine, 9,9-bis(4-amino-3-methylphenyl)fluorene, bis(3-amino-4-hydroxyphenyl) sulfone, 3-aminobenzylamine, 1,4-bis(4-aminophenoxy)benzene, 1,3-bis(3-aminophenoxy)benzene, 2,2-bis[4-(4-aminophenoxy)phenyl]hexafluoropropane, 2,2-bis(3-amino-4-hydroxyphenyl)hexafluoropropane, 4,4'-bis(4-aminophenoxy)biphenyl, 1,1-bis(4-aminophenyl)cyclohexane, 3,4'-diaminodiphenyl ether, 4,4'-ethylenedianiline, 2,3,5,6-tetramethyl-1,4-phenylenediamine, 2,2-bis(3-amino-4-hydroxylphenyl)propane, 1,4-bis(4-amino-2-trifluoromethylphenoxy)benzene, 1,3-bis(4-aminophenoxy)benzene, bis[4-(4-aminophenoxy)phenyl] sulfone, 4,4'-methylenebis(2-ethyl-6-methylaniline), m-tolidine, bis(4-aminophenyl) sulfide, o-tolidine, 4,4'-diamino-3,3'-dimethyldiphenylmethane, 4,4'-diaminobenzophenone, 3,3'-diaminobenzophenone, 3,3'-diaminodiphenylmethane, 9,9-bis(4-amino-3-fluorophenyl)fluorene, 9,9-bis(4-amino-3-chlorophenyl)fluorene, 4,4'-diamino-2,2'-dimethylbibenzyl, and combinations thereof.

6. The method of claim 1, wherein said exposing is carried out at a dosage of from about 100 mJ/cm$^2$ to about 1,300 mJ/cm$^2$.

7. The method of claim 1, wherein said providing said stack comprises forming said bonding layer on said front surface.

8. The method of claim 7, wherein said forming comprises applying a flowable bonding composition to said front surface, said flowable composition comprising said polyazomethine dispersed or dissolved in a solvent system.

9. The method of claim 8, further comprising heating said composition at a temperature of from about 50° C. to about 300° C. for a time period of from about 30 seconds to about 20 minutes to form said bonding layer.

10. The method of claim 7, wherein said forming comprises adhering a free-standing film comprising said polyazomethine to said front surface to form said bonding layer.

11. The method of claim 1, wherein one of said front surface and said first surface is selected from the group consisting of:
(1) a device surface comprising an array of devices selected from the group consisting of integrated circuits; MEMS; microsensors; power semiconductors; light-emitting diodes; photonic circuits; interposers; embedded passive devices; and microdevices fabricated on or from silicon, silicon-germanium, gallium arsenide, and gallium nitride; and
(2) a device surface comprising at least one structure selected from the group consisting of: solder bumps; metal posts; metal pillars; and structures formed from a material selected from the group consisting of silicon, polysilicon, silicon dioxide, silicon (oxy)nitride, metal, low k dielectrics, polymer dielectrics, metal nitrides, and metal silicides.

12. The method of claim 1, wherein one of said first and second substrates comprises glass or other transparent material.

13. The method of claim 1, further comprising subjecting said stack to processing selected from the group consisting of back-grinding, chemical-mechanical polishing, etching, metallizing, dielectric deposition, patterning, passivation, annealing, redistribution layer formation, and combinations thereof, prior to separating said first and second substrates.

14. The method of claim 1, wherein said bonding layer is the only layer between said first and second substrates.

15. The method of claim 1, wherein said bonding layer is non-photosensitive.

* * * * *